United States Patent
Pai et al.

(10) Patent No.: US 12,095,019 B2
(45) Date of Patent: Sep. 17, 2024

(54) DISPLAY DEVICE AND METHOD OF FABRICATING THEREOF

(71) Applicant: AU Optronics Corporation, Hsin-Chu (TW)

(72) Inventors: Chia-Hui Pai, Hsin-Chu (TW); Wen-Hsien Tseng, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 445 days.

(21) Appl. No.: 17/509,282

(22) Filed: Oct. 25, 2021

(65) Prior Publication Data

US 2022/0376151 A1 Nov. 24, 2022

(30) Foreign Application Priority Data

May 21, 2021 (CN) .......................... 202110556720.6

(51) Int. Cl.
*H01L 33/62* (2010.01)
*H01L 33/00* (2010.01)

(52) U.S. Cl.
CPC ............ *H01L 33/62* (2013.01); *H01L 33/005* (2013.01)

(58) Field of Classification Search
CPC ......... H01L 21/6835; H01L 2221/6835; H01L 2221/68368; H01L 25/0753; H01L 33/62
See application file for complete search history.

(56) References Cited

U.S. PATENT DOCUMENTS

| | | | |
|---|---|---|---|
| 2016/0365702 A1 | 12/2016 | Bower et al. | |
| 2019/0074206 A1* | 3/2019 | Chen | B65G 47/90 |
| 2020/0075560 A1 | 3/2020 | Zou et al. | |
| 2020/0227373 A1 | 7/2020 | Song et al. | |
| 2021/0005588 A1 | 1/2021 | Chung et al. | |
| 2021/0111325 A1 | 4/2021 | Kim et al. | |
| 2022/0293548 A1 | 9/2022 | Song et al. | |

FOREIGN PATENT DOCUMENTS

| | | |
|---|---|---|
| CN | 103887377 A | 6/2014 |
| CN | 111373554 A | 7/2020 |
| CN | 111477651 A | 7/2020 |
| KR | 20190029154 A1 | 3/2019 |
| KR | 20190031089 A1 | 3/2019 |

* cited by examiner

*Primary Examiner* — Daniel P Shook
(74) *Attorney, Agent, or Firm* — WPAT, P.C

(57) ABSTRACT

A display device includes a light emitting element, an adhesive barrier wall and an array substrate. The light emitting element includes a first contact and a second contact disposed on a first surface of the light emitting element. The adhesive barrier wall is disposed on the first surface of the light emitting element and includes a first portion between the first contact and the second contact. The array substrate includes a first pad and a second pad disposed on a second surface of the array substrate. The first contact and the second contact of the light emitting element are respectively connected to the first pad and the second pad.

19 Claims, 29 Drawing Sheets

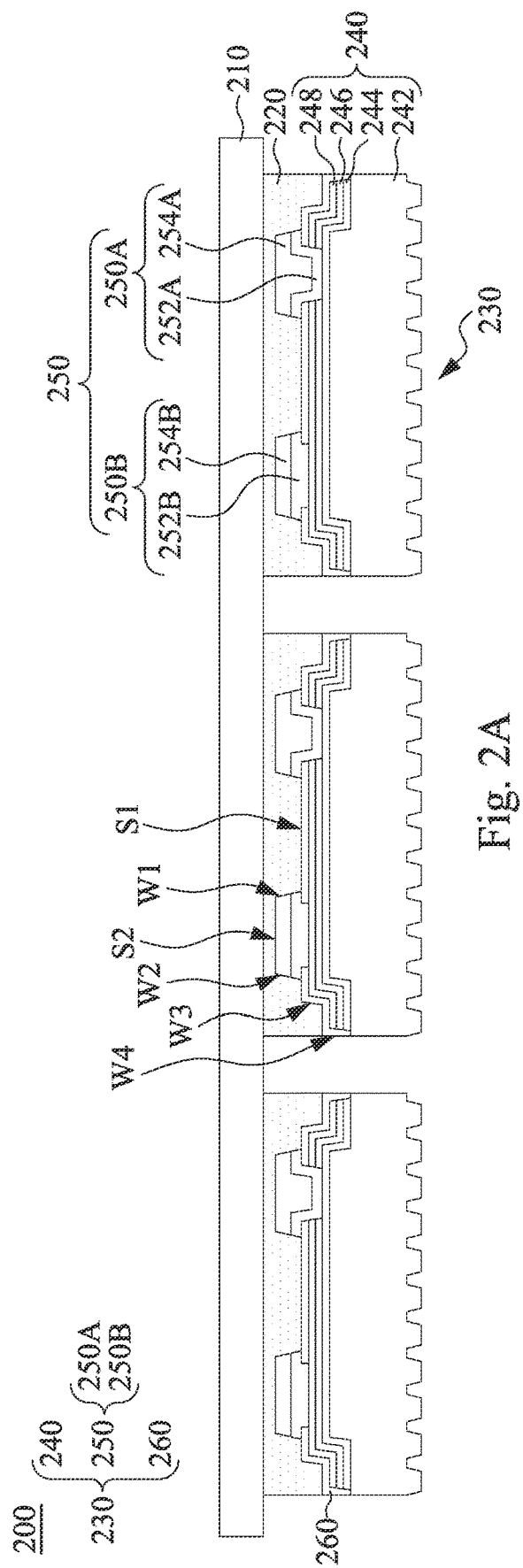
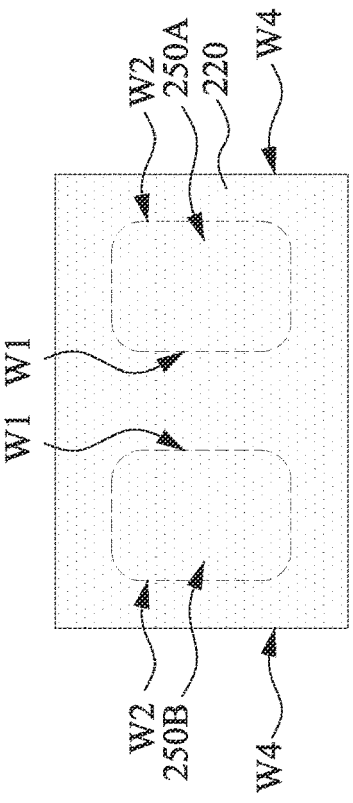
Fig. 2A
Fig. 2B

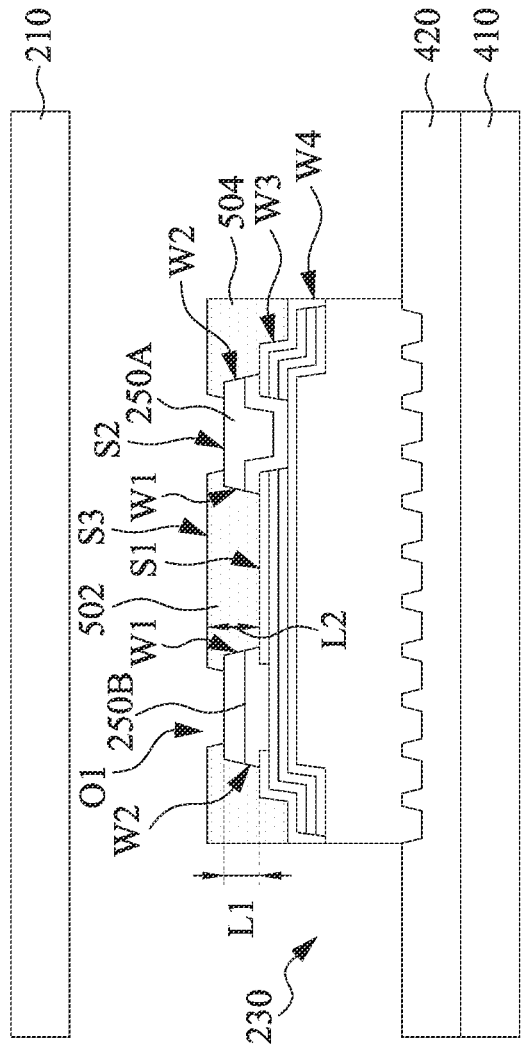
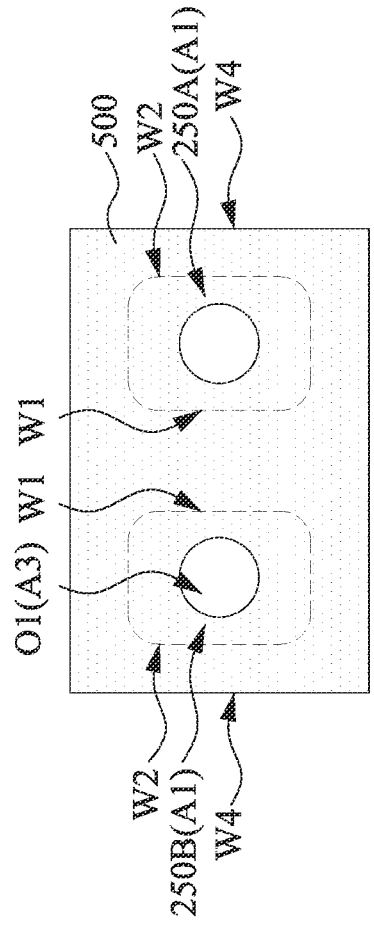
Fig. 5A
Fig. 5B

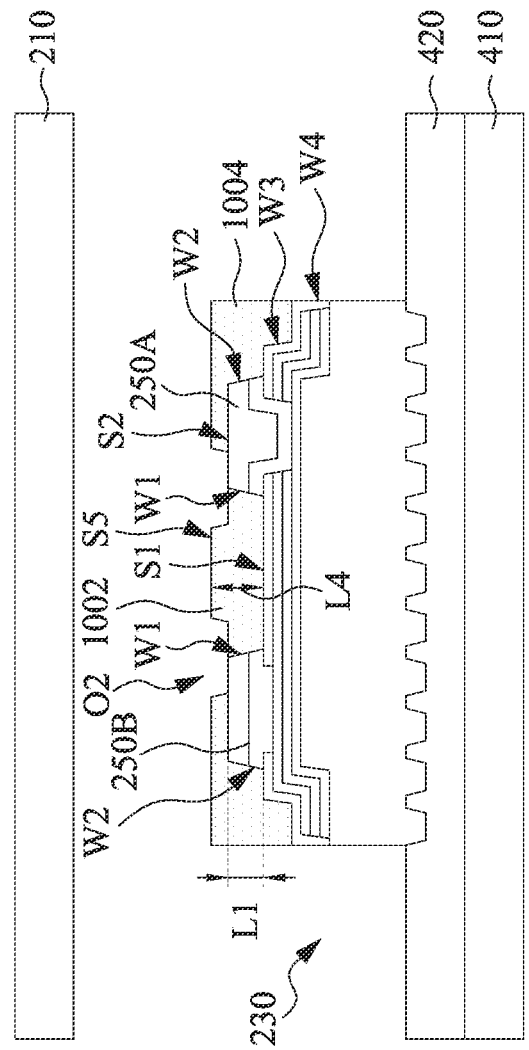
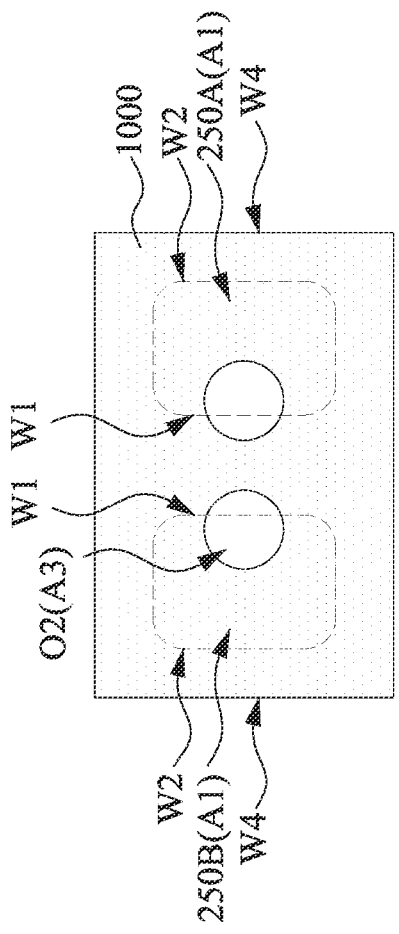
Fig. 10A
Fig. 10B

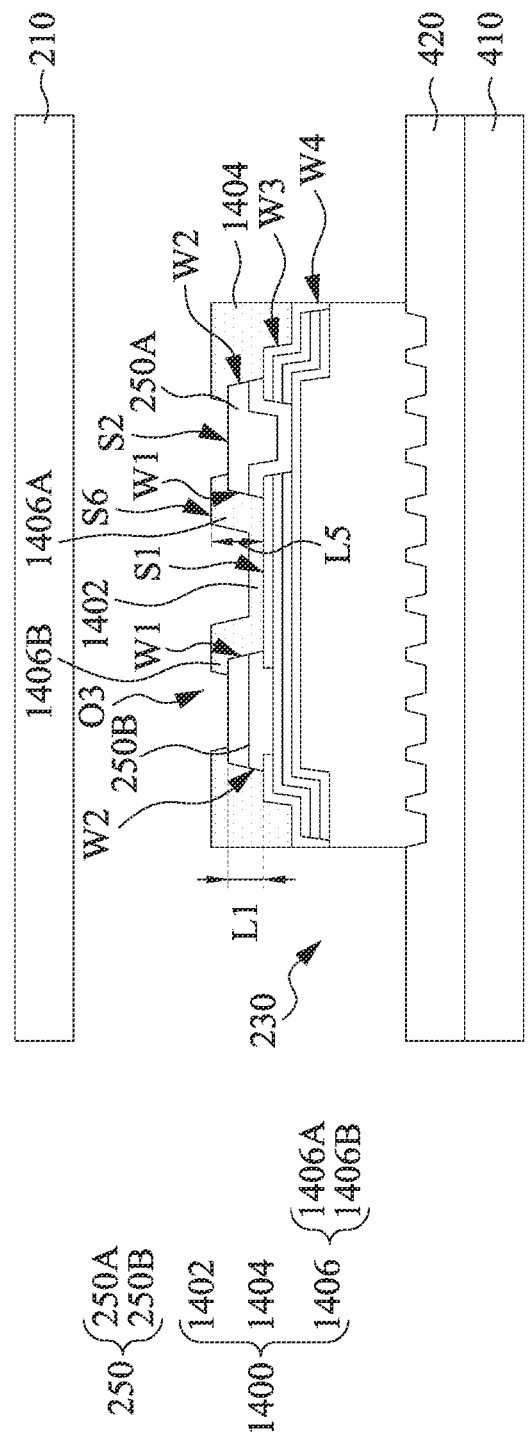
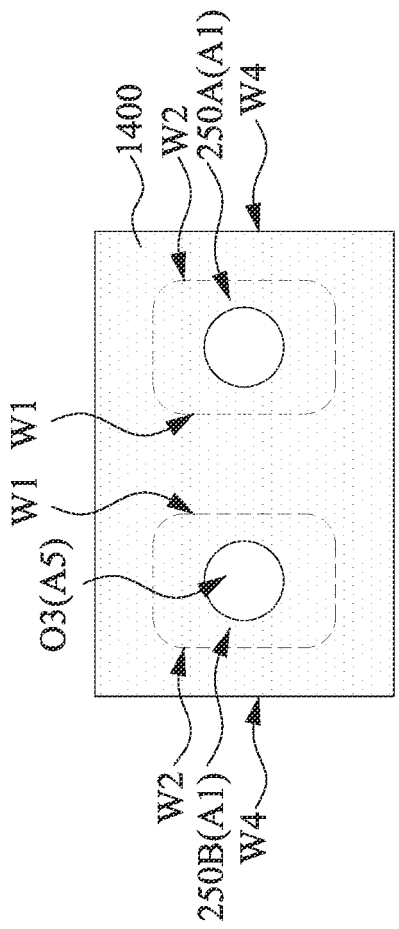
Fig. 14A
Fig. 14B

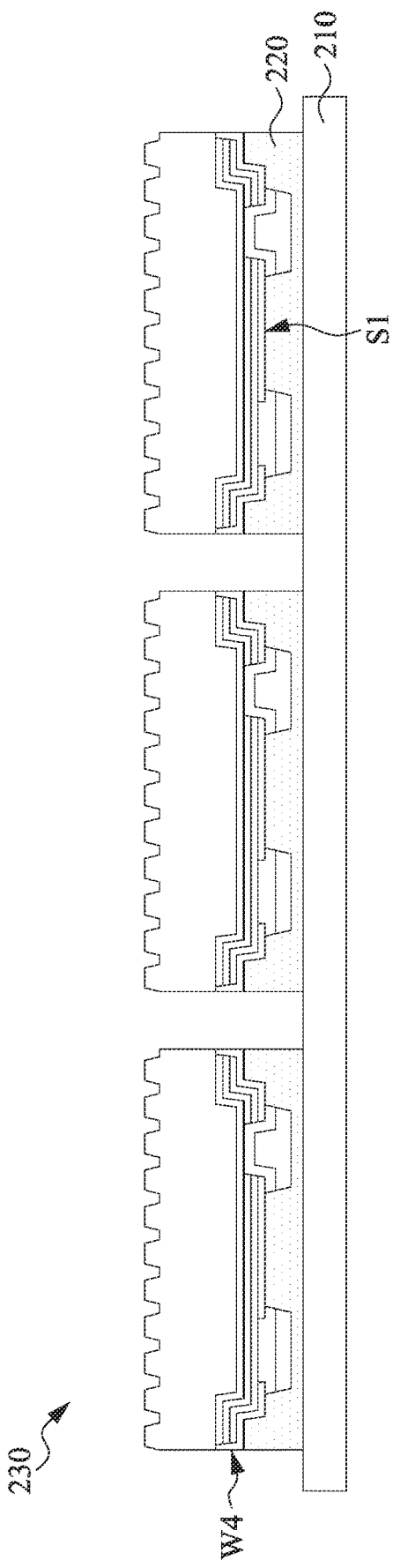
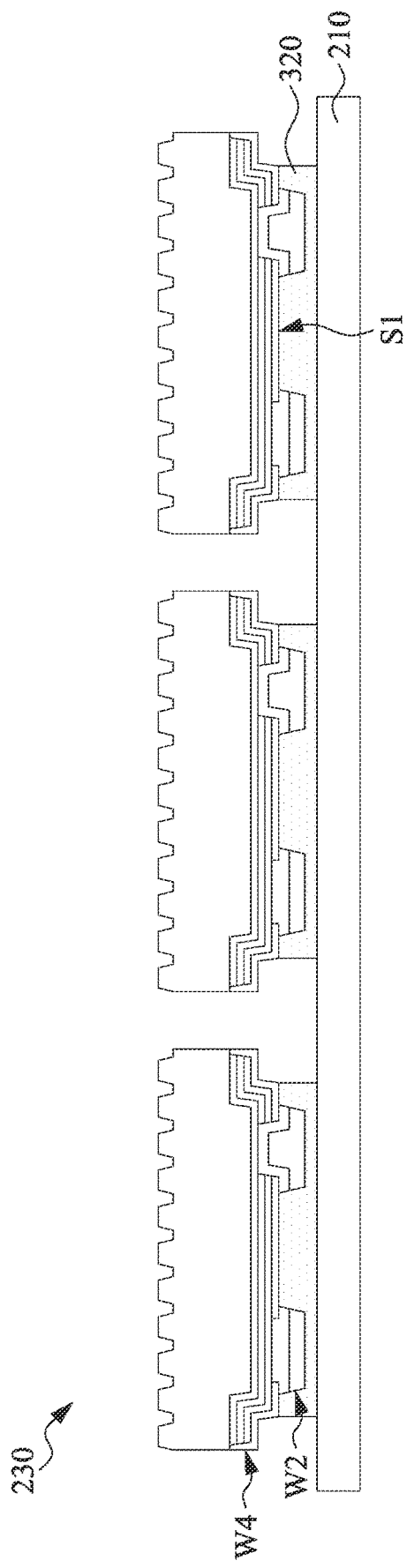
Fig. 31A
Fig. 31B

DISPLAY DEVICE AND METHOD OF FABRICATING THEREOF

CROSS-REFERENCE TO RELATED APPLICATION

This application claims priority to China Application Serial Number 202110556720.6, filed May 21, 2021, which is herein incorporated by reference in its entirety.

BACKGROUND

Field of Invention

The present disclosure relates to a display device and a method of fabricating thereof. More particularly, the present disclosure relates to the display device with a micro light emitting diode (LED).

Description of Related Art

The light emitting diode (LED) is widely applied in illuminations and displays for its advantages including small size, low power consumption, long life time, luminescence, and so on. The micro LED is a new technique in displays for better contrast, prompter reaction and lower power consumption. The micro LED is produced in a form of a single chip. Therefore, during the fabrication of display devices, micro LEDs are transferred onto another substrate (e.g., carrier substrate) in a method of mass transfer. In addition, the scaling down of the micro LEDs increases the difficulty in fabricating the display devices.

SUMMARY

An aspect of the present disclosure provides a display device including a light emitting element, an adhesive barrier wall and an array substrate. The light emitting element includes a first contact and a second contact disposed on a first surface of the light emitting element. The adhesive barrier wall is disposed on the first surface of the light emitting element and includes a first portion between the first contact and the second contact. The array substrate includes a first pad and a second pad disposed on a second surface of the array substrate. The first contact and the second contact of the light emitting element are respectively connected to the first pad and the second pad.

An aspect of the present disclosure provides a method of fabricating display device. The method of fabricating display device includes providing a transferring device, performing a first laser process, and performing a second laser process. The transferring device includes a first substrate, a patterned adhesive layer disposed on the first substrate, and a light emitting element disposed on the patterned adhesive layer and bonded to the first substrate by the patterned adhesive layer. The performing the first laser process is to detach and transfer the light emitting element from the first substrate to a second substrate, and to pattern the patterned adhesive layer such that an adhesive barrier wall is formed. The adhesive barrier wall is disposed between a first contact of the light emitting element and a second contact of the light emitting element. The performing the second laser process is to bond the light emitting element onto an array substrate.

It is to be understood that both the foregoing general description and the following detailed description are by examples, and are intended to provide further explanation of the disclosure as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A is a cross-sectional view of one of operation stages in a method of fabricating a display device, in accordance with some embodiments.

FIG. 2B is a top view of a light emitting element illustrated in FIG. 2A, in accordance with some embodiments.

FIG. 5A is a cross-sectional view of one of operation stages in a method of fabricating a display device, in accordance with some embodiments.

FIG. 5B is a top view of a light emitting element illustrated in FIG. 5A, in accordance with some embodiments.

FIG. 10A is a cross-sectional view of one of operation stages in a method of fabricating a display device, in accordance with some other embodiments.

FIG. 10B is a top view of a light emitting element illustrated in FIG. 10A, in accordance with some embodiments.

FIG. 14A is a cross-sectional view of one of operation stages in a method of fabricating a display device, in accordance with some other embodiments.

FIG. 14B is a top view of a light emitting element illustrated in FIG. 14A, in accordance with some embodiments.

FIGS. 29, 30, 31A and 31B are a cross-sectional view of various operation stages of fabricating a transferring device used in a fabrication of a display device, in accordance with some other embodiments.

DETAILED DESCRIPTION

Figure 1:
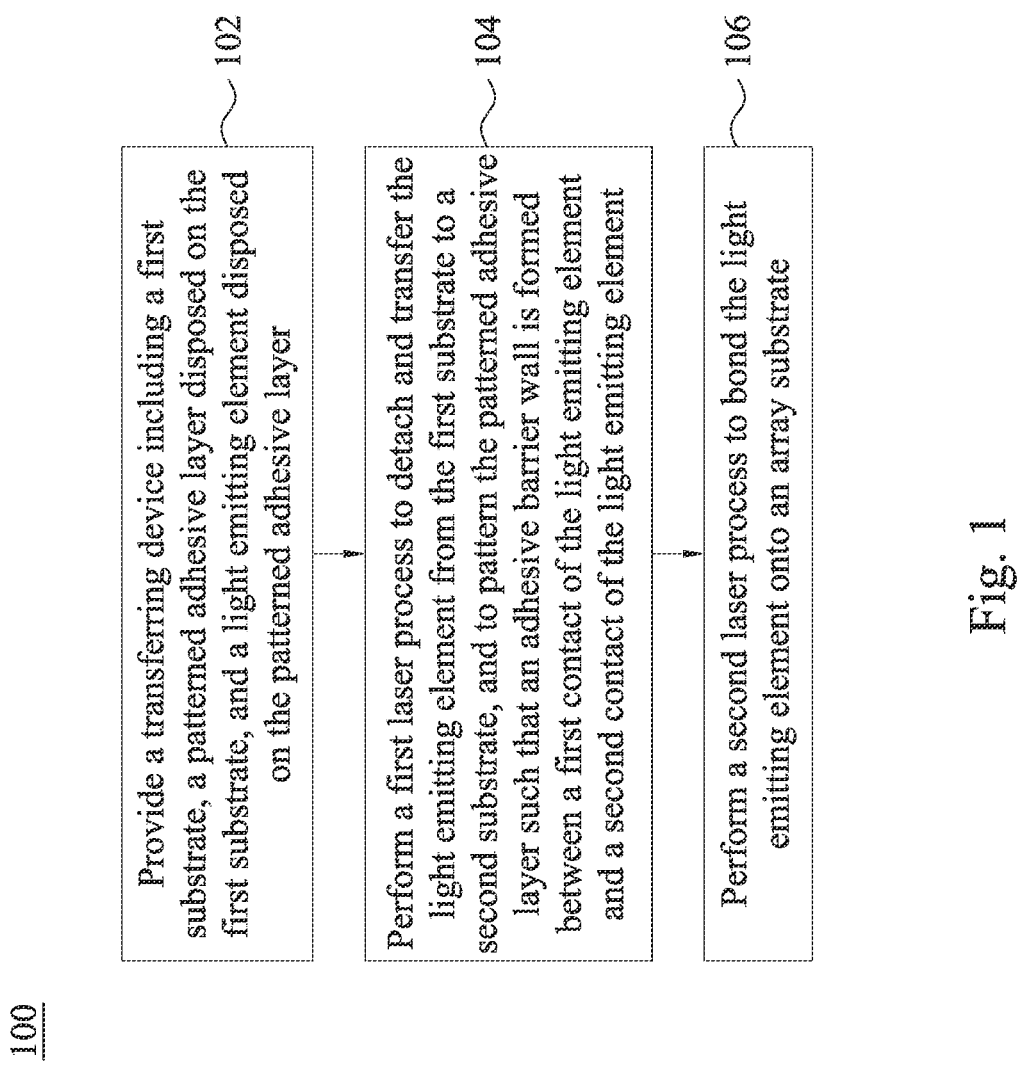
FIG. 1 is a flowchart of a method of fabricating a display device, in accordance with some embodiments.

Reference will now be made in detail to the present embodiments of the disclosure, examples of which are illustrated in the accompanying drawings. Wherever possible, the same reference numbers are used in the drawings and the description to refer to the same or like parts.

The following disclosure provides many different embodiments, or examples, for implementing different features of the disclosure. For illustration clarity, many details of practice are explained in the following descriptions. However, it should be understood that these details of practice do not intend to limit the present disclosure. That is, these details of practice are not necessary in parts of embodiments of the present disclosure. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The use of ordinals such as first, second and third does not necessarily imply a ranked sense of order, but rather may only distinguish between multiple instances of an act or structure.

In some embodiments, the terms "about" and "substantially" can refer to a percentage of the values as interpreted by those skilled in relevant art(s) in light of the teachings herein. The terms "about" and "substantially" can indicate a value of a given quantity that varies within an acceptable deviation of the value. These values are merely examples and are not intended to be limiting.

In current display device, contacts are configured on a light emitting element such as light emitting diode (LED) such that the light emitting element can be bonded to and electrically connected to an array substrate through the contacts. With a scaling down of the light emitting element (e.g., micro LED in micron level), a reduced distance between the contacts may cause the contacts form an unexpected electrical connection during a bonding process, and further a short happen. The present disclosure provides a display device and a method of fabricating thereof to decrease a possibility of short by preventing the contacts from contacting each other, thereby increasing process reliability.

Referring to FIGS. 1, 2A and 2B, FIG. 1 is a flowchart of a method 100 of fabricating a display device in accordance with some embodiments, FIG. 2A is a cross-sectional view of one of operation stages in method 100 of fabricating the display device in accordance with some embodiments, and FIG. 2B is a top view of a light emitting element 230 illustrated in FIG. 2A in accordance with some embodiments. In FIG. 2B, a first substrate 210 is omitted, and exemplary positions where a first contact 250A and a second contact 250B are disposed are illustrated with the broken lines.

While the method 100 is illustrated and described below as a series of acts or events, it will be appreciated that the illustrated ordering of such acts or events are not to be interpreted in a limiting sense. For example, some acts or events may occur in different orders, not be implemented and/or occur concurrently with other acts or events. Moreover, it is understood that additional processes can be provided before, during, and/or after the method 100. Accordingly, some other processes may be briefly described herein.

In operation 102, a transferring device 200 is provided. The transferring device 200 may include the first substrate 210, a patterned adhesive layer 220 disposed on the first substrate 210, and the light emitting element 230 disposed on the patterned adhesive layer 220 and bonded to the first substrate 210 by the patterned adhesive layer 220. In some embodiments, the light emitting element 230 may include a semiconductor stack 240, multiple contacts 250 (e.g., two contacts as illustrated in FIG. 2A) and a protection layer 260.

In order to ensure an adhesive layer and the light emitting element 230 transferred together from one substrate to another substrate, the patterned adhesive layer 220 can be implemented in operation 102. An adhesion of the patterned adhesive layer 220 may be weakened after a patterning process, consequently allowing the patterned adhesive layer 220 to be detached from the first substrate 210 and transferred to another substrate along with the light emitting element 230.

In some embodiments as illustrated in FIG. 2A, the patterned adhesive layer 220 of the transferring device 200 may be disposed between the first substrate 210 and the light emitting element 230. In some embodiments, the patterned adhesive layer 220 may separate the first substrate 210 and the light emitting element 230 so the first substrate 210 and the light emitting element 230 are not in direct contact with each other. In some embodiments, the patterned adhesive layer 220 may physically contact a first surface S1 of the light emitting element 230 and the contacts 250 disposed on the first surface S1. Specifically, the patterned adhesive layer 220 may physically contact a second surface S2, a first sidewall W1 and a second sidewall W2 of the contacts 250. The first sidewall W1 is between the contacts, and the second sidewall W2 is opposite to the first sidewall W1 and faces outwards. In some embodiments, the patterned adhesive layer 220 may also physically contact and cover sidewall of the light emitting element 230, such as a third sidewall W3.

In some embodiments, the patterned adhesive layer 220 can extend to a fourth sidewall W4 of the light emitting element 230. In some other embodiments, the patterned adhesive layer 220 can further extend and exceed the fourth sidewall W4 (not illustrated herein). As a result, in FIG. 2B, the patterned adhesive layer 220 may cover the light emitting element.

The first substrate 210 may include a glass substrate, a silicon substrate, or other suitable substrates. The patterned adhesive layer 220 may include epoxy, silicone, polyimide (PI), poly(methyl 2-methylpropenoate) (PMMA), or other suitable adhesive materials. In some embodiments, the patterned adhesive layer 220 can include PI. In some embodiments, the patterned adhesive layer 220 can include PMMA.

The semiconductor stack 240 may include an undoped semiconductor layer 242, an N-type doped semiconductor layer 244, a light emitting layer 246, and a P-type doped semiconductor layer 248. The N-type doped semiconductor layer 244, the light emitting layer 246, and the P-type doped semiconductor layer 248 may sequentially be formed on the undoped semiconductor layer 242. In another words, the light emitting layer 246 may be formed between N-type doped semiconductor layer 244 and the P-type doped semiconductor layer 248.

The light emitting element 230 of the present disclosure is a GaN-based LED, for example. In such embodiments, the P-type doped semiconductor layer 248 is, for example, a P-type GaN layer (p-GaN), and the N-type doped semiconductor layer 244 is, for example, an N-type GaN layer (n-GaN). In addition, the light emitting layer 246 is referred to as an active layer and a structure thereof is, for example, a multiple quantum well (MQW) formed by alternately stacking multiple InGaN layers and multiple GaN layers. The undoped semiconductor layer 242 is, for example, an undoped GaN layer (u-GaN).

The contacts 250 of the light emitting element 230 are disposed on the first surface S1 of the light emitting element 230. The contacts 250 may include the first contact 250A and the second contact 250B. The first contact 250A may include a first current spreading layer 252A and a first contact pad 254A. The first current spreading layer 252A is disposed between the first contact pad 254A and the N-type doped semiconductor layer 244 of the semiconductor stack 240, and the first contact pad 254A is electrically connected to the semiconductor stack 240 through the first current spreading layer 252A. The second contact 250B may include a second current spreading layer 252B and a second contact pad 254B. The second current spreading layer 252B is disposed between the second contact pad 254B and the P-type doped semiconductor layer 248 of the semiconductor stack 240, and the second contact pad 254B is electrically connected to the semiconductor stack 240 through the second current spreading layer 252B.

The first current spreading layer 252A may include transparent conductive materials such as indium tin oxide (ITO), indium zinc oxide (IZO) or a transparent metal layer, but the present disclosure is not limited to the above. The first contact pad 254A may include metallic materials, such as Au, Sn, Sn/Ag/Cu alloy, or Sn alloy, but the present disclosure is not limited to the above. A material of the second current spreading layer 252B may be selected as substantially same as a material of the first current spreading layer 252A, and a material of the second contact pad 254B may be selected as substantially same as a material of the first contact pad 254A.

The protection layer 260 of the light emitting layer 230 covers a surface and at least a portion of sidewall of the semiconductor stack 240. The protection layer 260 can provide functions of electrical insulation, protection and light reflection. The protection layer 260 may include silicon oxide, silicon nitride, or a stack of two materials with different refractive index, but the present disclosure is not limited to the above.

Figure 3A:
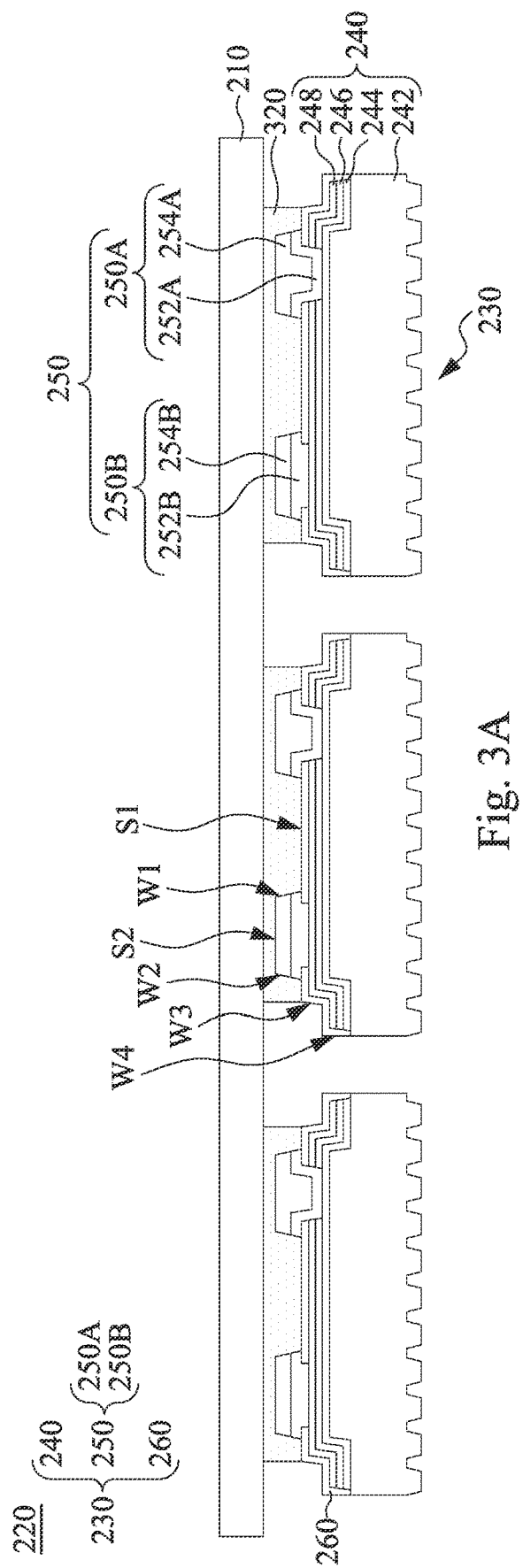
FIG. 3A is a cross-sectional view of one of operation stages in a method of fabricating a display device, in accordance with some other embodiments.
Figure 3B:
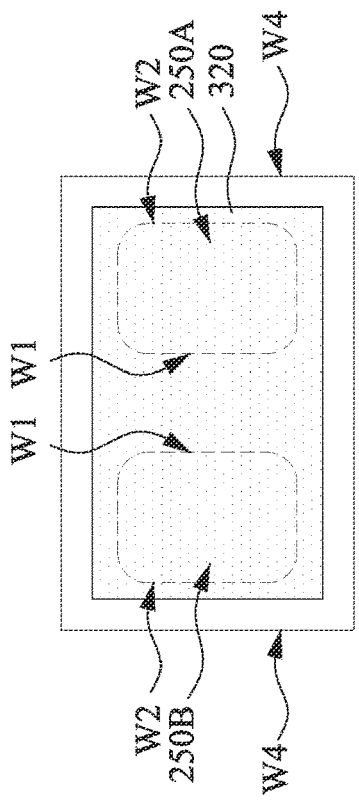
FIG. 3B is a top view of a light emitting element illustrated in FIG. 3A, in accordance with some embodiments.

Referring to FIGS. 3A and 3B, FIG. 3A is a cross-sectional view of one of operation stages in the method 100 of fabricating the display device in accordance with some other embodiments and FIG. 3B is a top view of the light emitting element 230 illustrated in FIG. 3A in accordance with some embodiments. In FIG. 3B, the first substrate 210 is omitted, and exemplary positions where the first contact 250A and the second contact 250B are disposed are illustrated with the broken lines.

Structures in FIGS. 3A and 3B are substantially same as structures in FIGS. 2A and 2B. The only difference is that an extent of a patterned adhesive layer 320 used to contact the light emitting element 230 is smaller than an extent of the patterned adhesive layer 220 used to contact the light emitting element 230.

Similar to the patterned adhesive layer 220 (see FIG. 2A), in some embodiments as illustrated in FIG. 3A, the patterned adhesive layer 320 of the transferring device 200 may be disposed between the first substrate 210 and the light emitting element 230. In some embodiments, the patterned adhesive layer 320 may separate the first substrate 210 and the light emitting element 230 such that the first substrate 210 and the light emitting element 230 are not in direct contact with each other. In some embodiments, the patterned adhesive layer 320 may physically contact the first surface S1 of the light emitting element 230 and the contacts 250 disposed on the first surface S1. Specifically, the patterned adhesive layer 320 may physically contact and cover the second surface S2, the first sidewall W1 and the second sidewall W2 of the contacts 250. The first sidewall W1 is between the contacts, and the second sidewall W2 is opposite to the first sidewall W1 and faces outwards.

Compared to the patterned adhesive layer 220 (see FIG. 2A) which can further extend to the fourth sidewall W4 of the light emitting element 230, the extent of the patterned adhesive layer 320 may reach between the second sidewall W2 of the contacts 250 and the fourth sidewall W4 of the light emitting element 230. For example, in the top view of FIG. 3B, the patterned adhesive layer 320 partially covers the light emitting element 230. It is understood that the patterned adhesive layer 320 still covers the contacts 250 although patterned adhesive layer 320 partially covers the light emitting element 230.

The following illustrations have been simplified (e.g., only one light emitting element 230 is shown) for the sake of clarity to better understand the inventive concepts of the present disclosure. It is appreciated that multiple light emitting element 230 can be disposed on the first substrate 210.

Referring to FIGS. 1, 4, 5A and 5B, FIG. 4 is a cross-sectional view of one of operation stages in method 100 of fabricating a display device in accordance with some other embodiments, FIG. 5A is a cross-sectional view of one of operation stages in method 100 of fabricating a display device in accordance with some embodiments, and FIG. 5B is a top view of the light emitting element 230 illustrated in FIG. 5A in accordance with some embodiments. In FIG. 5B, exemplary positions where the first contact 250A and the second contact 250B are disposed are illustrated with the broken lines. In addition, the transferring device 200 with the patterned adhesive layer 220 illustrated in FIGS. 2A and 2B is employed in FIGS. 4, 5A and 5B for an exemplary description.

In operation 104, a first laser process is performed to detach and transfer the light emitting element 230 from the first substrate 210 to a second substrate 410, and concurrently to pattern the patterned adhesive layer 220 such that an adhesive barrier wall 500 is formed and disposed between the first contact 250A and the second contact 250B.

Figure 4:
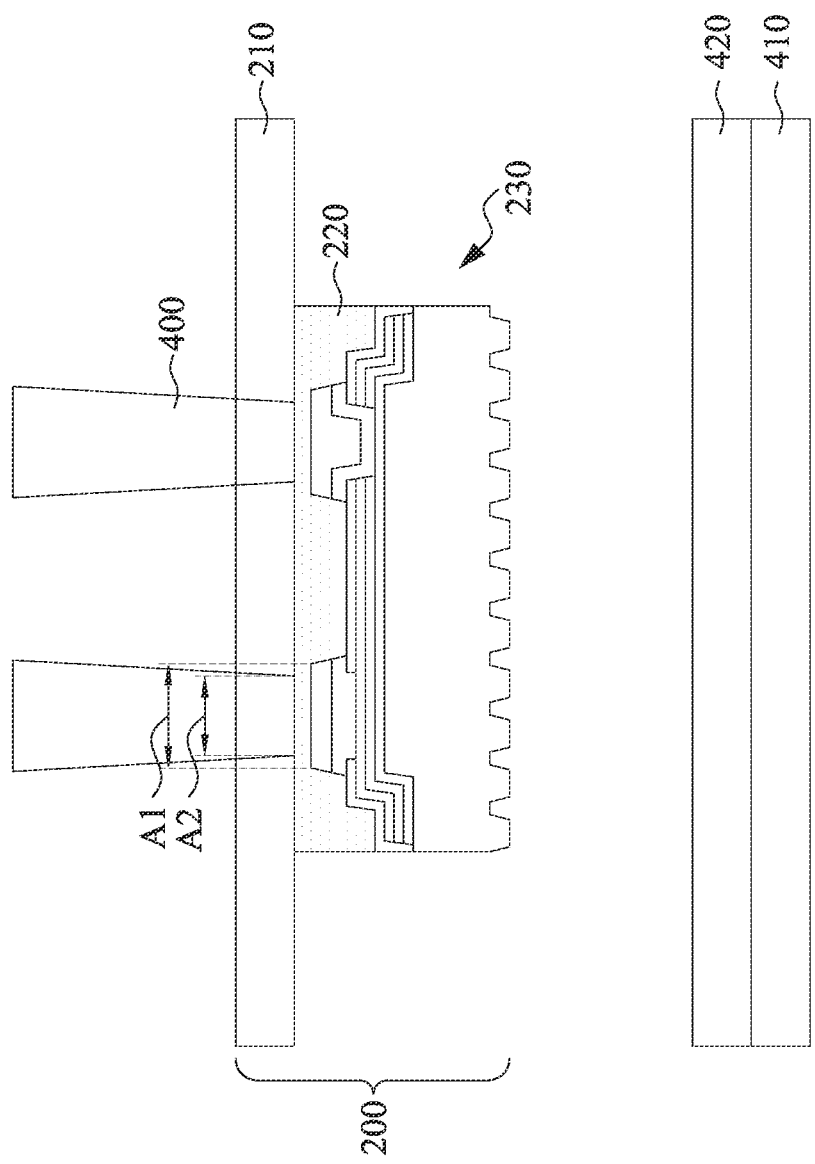
FIG. 4 is a cross-sectional view of one of operation stages in a method of fabricating a display device, in accordance with some other embodiments.

In FIG. 4, a first laser 400 used in the first laser process may pass through the first substrate 210 and irradiate the patterned adhesive layer 220. The first laser 400 may include multiple irradiation areas A2 on the patterned adhesive layer 220. The irradiation areas A2 may not overlap each other. That is, the irradiation areas A2 may be spaced apart from each other. In some embodiments, single irradiation area A2 of the first laser 400 may be smaller than an area A1 of individual contact 250.

The first laser 400 having a wavelength in a selected range can pattern a material of the patterned adhesive layer 220. In some embodiments, the first laser 400 may have a wavelength ranging between about 250 nm and about 400 nm. For example, the first laser 400 may have a wavelength ranging between about 300 nm and about 350 nm.

The light emitting element 230 may originally be attached to the first substrate 210 with the patterned adhesive layer 220. Due to a removal of a portion of the patterned adhesive layer 220 by the first laser process with the first laser 400, an adhesion of the patterned adhesive layer 220 to the first substrate 210 may be weakened. With a weak adhesion, the patterned adhesive layer 220 cannot remain on the first substrate 210 and may be separated from the first substrate 210. Therefore, the light emitting element 230 along with the patterned adhesive layer 220 may be detached from the first substrate 210 and transferred to the second substrate 410 and a second adhesive layer 420. During the above detaching and transferring process, the patterned adhesive layer 220 may keep physically contacting the light emitting element 230.

In addition to the above-mentioned detaching and transferring, the removal of a portion of the patterned adhesive layer 220 by the first laser process with the first laser 400 can concurrently provide the function of patterning the patterned adhesive layer 220 such that an adhesive barrier wall 500 is formed. In another words, after the first laser process with the first laser 400, the patterned adhesive layer 220 may become the adhesive barrier wall 500.

The adhesive barrier wall 500 may include an opening O1 having an area A3, and the opening O1 can be resulted from the removal of a portion of the patterned adhesive layer 220 by the first laser process with the first laser 400. In some embodiments, the area A3 of the opening O1 can be substantially same as the single irradiation area A2. In some embodiments, the area A3 of the opening O1 can be smaller than the single irradiation area A2. Further, the first contact 250A and the second contact 250B are respectively exposed from the opening O1. In some embodiments as illustrated in FIGS. 5A and 5B, the opening O1 is respectively located within the first contact 250A and the second contact 250B.

The adhesive barrier wall 500 may substantially equals to the patterned adhesive layer 220 (see FIGS. 2A and 2B) except the opening O1. The adhesive barrier wall 500 may be disposed on the first surface S1 of the light emitting element 230. The adhesive barrier wall 500 may include a first portion 502 and a second portion 504. The first portion 502 may be disposed between the adjacent contacts 250 of the light emitting element 230. For example, the first portion 502 of the adhesive barrier wall 500 may physically contact the first contact 250A and the second contact 250B, as illustrated in FIG. 5A. In some embodiments, a lateral space between the first sidewall W1 of the first contact 250A and the first sidewall W1 of the second contact 250B may be entirely filled with the first portion 502 of the adhesive barrier wall 500. The second portion 504 of the adhesive barrier wall 500 may be disposed on the second sidewall W2 of the contacts 250.

In some embodiments, the adhesive barrier wall 500 may physically contact the first surface S1 of the light emitting element 230 as well as the contacts 250 disposed on the first surface S1. Specifically speaking, the adhesive barrier wall 500 may physically contact and cover the second surface S2, the first sidewall W1 and the second sidewall W2 of the contacts 250. In another words, a length L1 between the second surface S2 of the contacts 250 and the first surface S1 of the light emitting element 230 may be smaller than a length L2 between a third surface S3 of the adhesive barrier wall 500 and the first surface S1 of the light emitting element 230. In some embodiments, the second portion 504 of the adhesive barrier wall 500 may physically contact and cover sidewall of the light emitting element 230, such as the third sidewall W3.

In some embodiments, the second substrate 410 may include a glass substrate, a silicon substrate, or other suitable substrates. The second adhesive layer 420 may include benzocyclobutene (BCB), epoxy, silicone, PI, PMMA, or other suitable adhesive materials. In some embodiments, the second adhesive layer 420 is different from the patterned adhesive layer 220.

Figure 6:
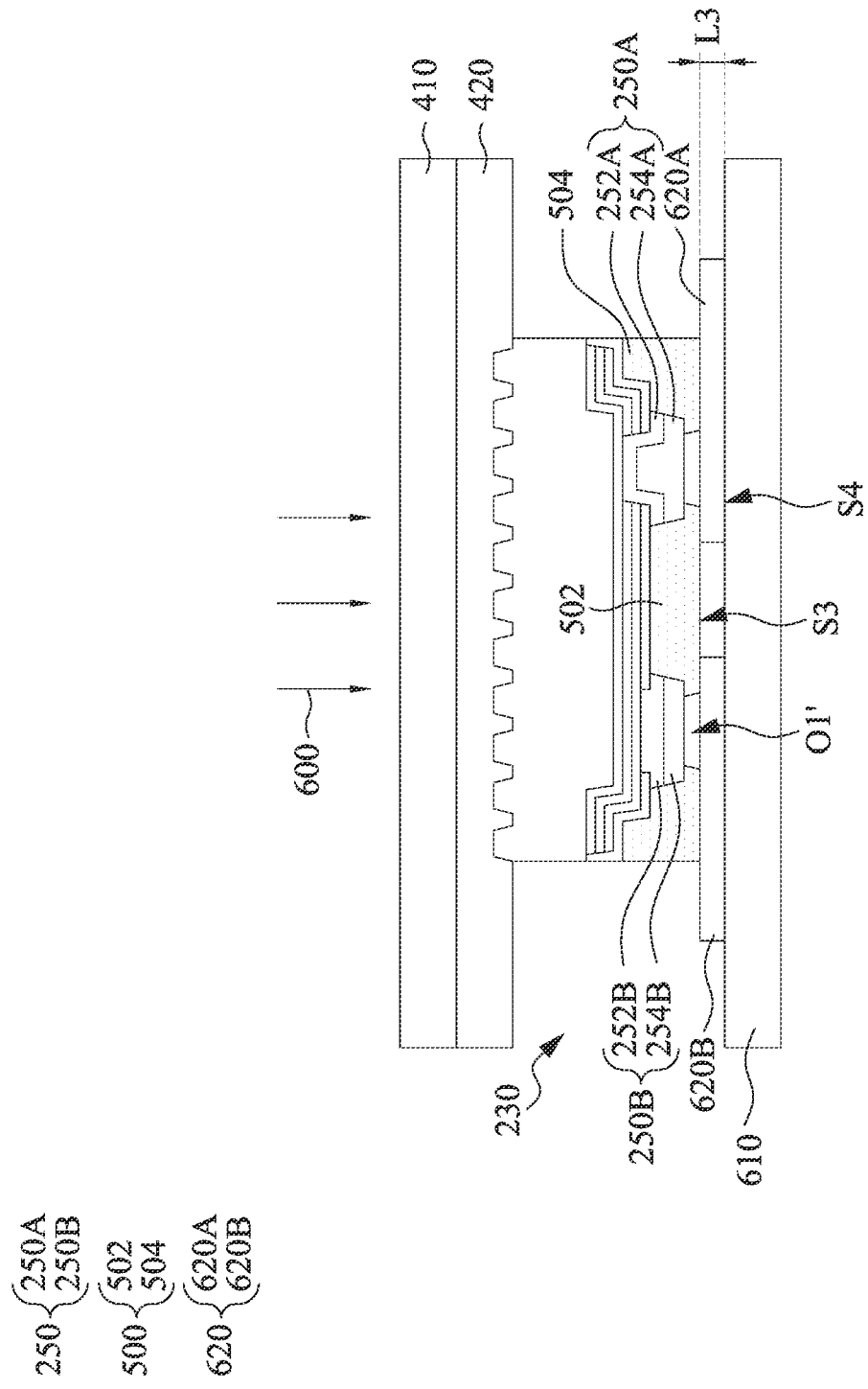
FIG. 6 is a cross-sectional view of one of operation stages in a method of fabricating a display device, in accordance with some embodiments.
Figure 7:
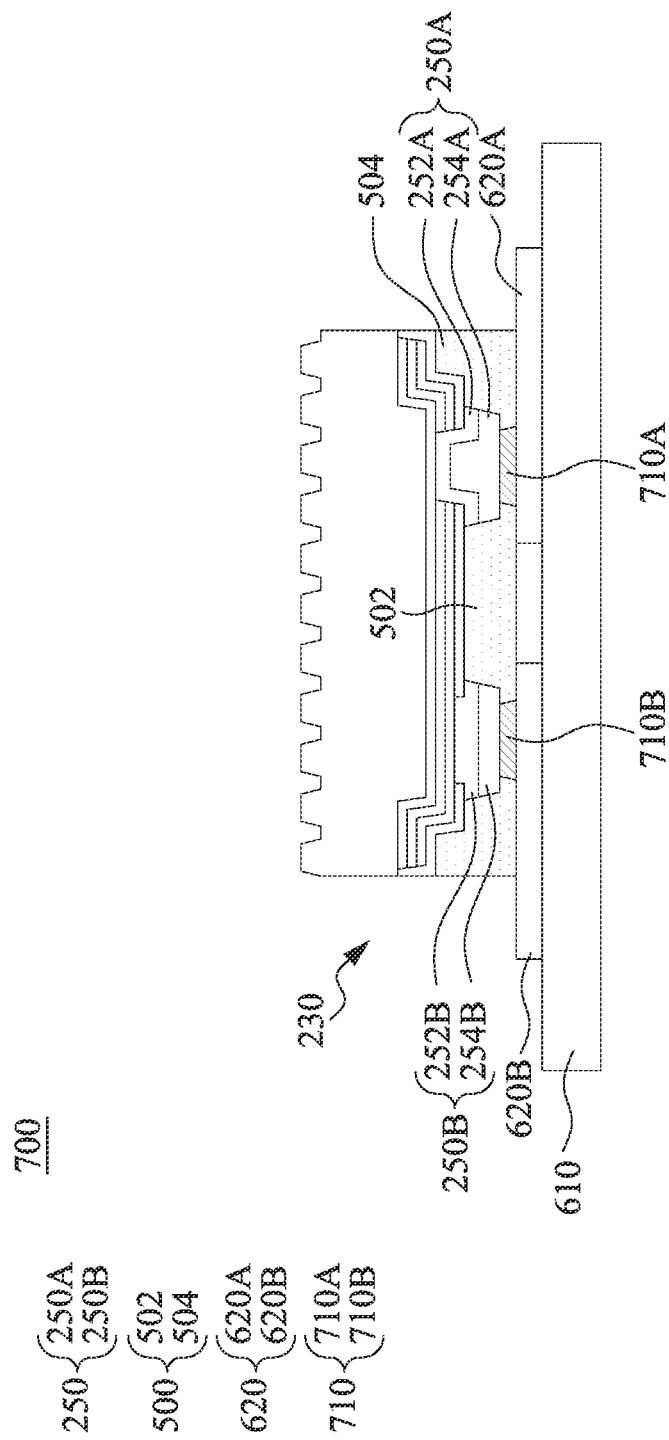
FIG. 7 is a cross-sectional view of one of operation stages in a method of fabricating a display device, in accordance with some embodiments.

Referring to FIGS. 1, 6 and 7, FIG. 6 is a cross-sectional view of one of operation stages in the method 100 of fabricating a display device in accordance with some embodiments and FIG. 7 is a cross-sectional view of one of operation stages in the method 100 of fabricating a display device, in accordance with some embodiments. A structure in FIGS. 6 and 7 is an inverted structure of FIG. 5A.

In operation 106, a second laser process with a second laser 600 is performed to bond the light emitting element 230 onto an array substrate 610 and to remove the second substrate 410 and the second adhesive layer 420, such that a display device 700 can be formed.

In FIG. 6, after a structure of FIG. 5A is inverted, the light emitting element 230 may be disposed onto the array substrate 610 from a side of the third surface S3 of the adhesive barrier wall 500. The array substrate 610 may include multiple pads 620 disposed on a fourth surface S4 of the array substrate 610. The pads 620 of the array substrate 610 may include a first pad 620A and a second pad 620B. The first pad 620A may correspond to the first contact 250A and the second pad 620B may correspond to the second contact 250B.

When the light emitting element 230 is disposed on the array substrate 610, the third surface S3 of the adhesive barrier wall 500 may physically contact the first pad 620A, the second pad 620B, or the first pad 620A and the second pad 620B. In some embodiments as illustrated in FIG. 6, a portion of the adhesive barrier wall 500 may be between the first contact 250A and the first pad 620A or between the second contact 250B and the second pad 620B.

In some embodiments, the third surface S3 of the adhesive barrier wall 500 may not contact the fourth surface S4 of the array substrate 610. Specifically, the third surface S3 of the first portion 502 may be spaced a length L3 apart from the fourth surface S4 of the array substrate 610.

The opening O1 illustrated in FIG. 5 may remain in the structure in FIG. 6 and may become a closed space O1' due to the fact that the light emitting element 230 is disposed on the pads 620 of the array substrate 610.

The second laser 600 may pass through the second substrate 410, the second adhesive layer 420 and part of the light emitting element 230. In some embodiments, the first contact pad 254A and the second contact pad 254B of the contacts 250 can absorb energy of the second laser 600 to increase temperature, such that a portion of the first contact pad 254A and the second contact pad 254B may be in a form of melted material (not illustrated). With the adhesive barrier wall 500, the flowable melted material can be confined within the closed space O1'.

In some embodiments as illustrated in FIG. 7, the melted material (not illustrated) may react with the first pad 620A and second pad 620B of the second laser 600 to form an intermetallic compound (IMC) 710. In some embodiments, the light emitting element 230 can be bonded to the array substrate 610 by the IMC 710. In some embodiments, the IMC 710 can electrically connect the light emitting element 230 and the pads 620 of the array substrate 610. In some embodiments, the closed space O1' can be filled with the IMC 710. The adhesive barrier wall 500 may make the IMC 710 formed at a suitable position and perform a function of electrical connection as expected. For example, a first IMC 710A may just electrically connect the first contact pad 254A of the light emitting element 230 and the first pad 620A of the array substrate 610. Similarly, a second IMC 710B may just electrically connect the second contact pad 254B of the light emitting element 230 and the second pad 620B of the array substrate 610.

The IMC 710 may include a material of the first contact pad 254A or the second contact pad 254B and a material of the 620A or the second pad 620B. The material of the pads 620 may include metal, such as Au, Ag, Cu, or other suitable material.

In FIG. 7, the second substrate 410 and the second adhesive layer 420 are removed. In some embodiments, the second substrate 410 and the second adhesive layer 420 can be removed by using a laser lift-off method, a photochemical reaction method or a photophysical reaction method. In some embodiments, a material of the second adhesive layer 420 can react with the second laser 600 (see FIG. 600), causing an adhesion of the second adhesive layer 420 to the light emitting element 230 decrease. Consequently, the second substrate 410 and the second adhesive layer 420 are removed away from the light emitting element 230.

In some embodiments, a wavelength of the second laser 600 can be larger than that of the first laser 400. In some embodiments, the second laser 600 may have a wavelength ranging between about 1000 nm and about 2000 nm. In some further embodiments, the second laser 600 may have a wavelength ranging between about 1000 nm and about 1500 nm.

Figure 8:
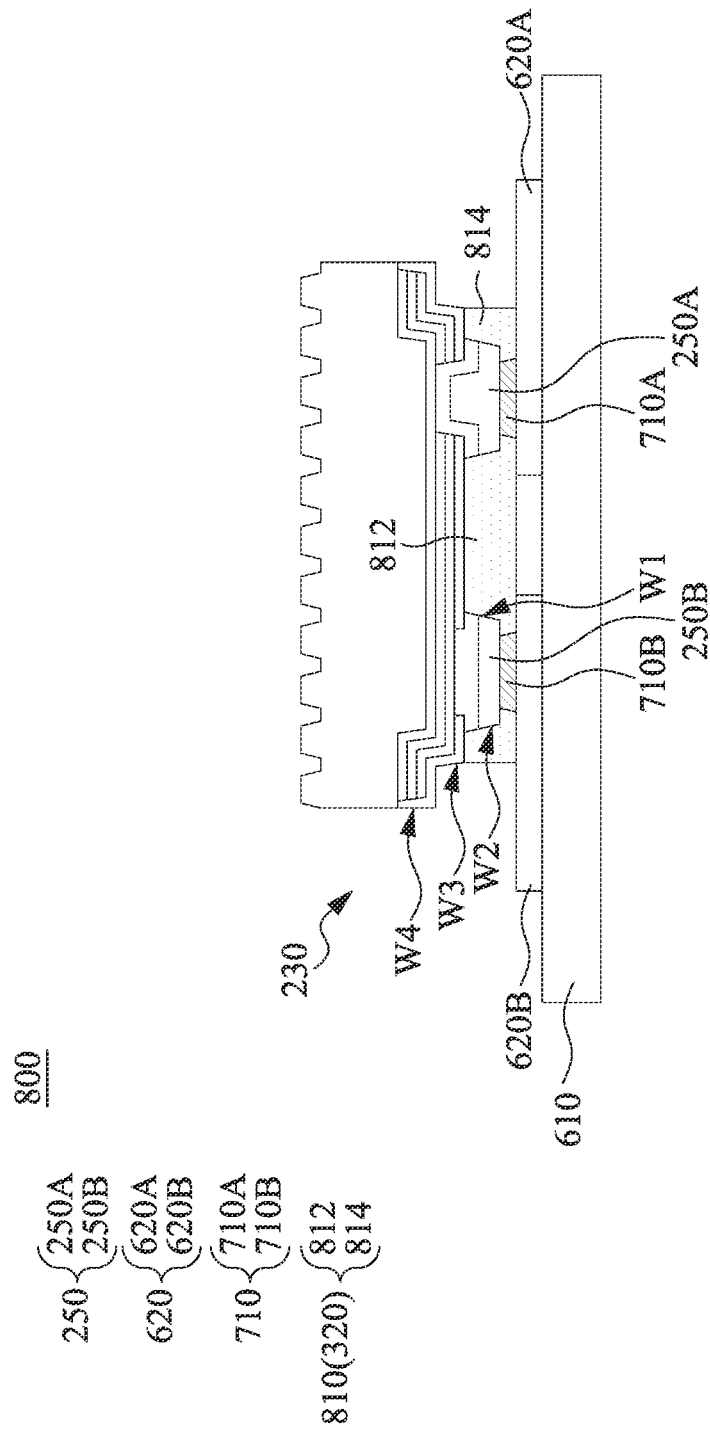
FIG. 8 is a cross-sectional view of one of operation stages in a method of fabricating a display device, in accordance with some other embodiments of FIG. 7.

Referring to FIG. 8, FIG. 8 is a cross-sectional view of one of operation stages in the method 100 of fabricating a display device in accordance with some embodiments. The transferring device 200 with the patterned adhesive layer 320 illustrated in FIGS. 3A and 3B is employed in FIG. 8 for an exemplary description. In another words, the patterned adhesive layer 320 can undergo operations 104 and 106, thereby forming a display device 800 with an adhesive barrier wall 810 in FIG. 8. The adhesive barrier wall 810 can be formed from the patterned adhesive layer 320.

The display device 800 in FIG. 8 is substantially same as the display device 700 in FIG. 7. The only difference is that an extent of the adhesive barrier wall 810 is smaller than an extent of the adhesive barrier wall 500 (see FIG. 7).

The adhesive barrier wall 810 may include a first portion 812 and a second portion 814. The first portion 812 may be disposed between the adjacent contacts 250 of the light emitting element 230. For example, the first portion 812 of the adhesive barrier wall 810 may physically contact the first contact 250A and the second contact 250B, as illustrated in FIG. 8. In some embodiments, a lateral space between the first sidewall W1 of the first contact 250A and the first sidewall W1 of the second contact 250B may be entirely filled with the first portion 812 of the adhesive barrier wall 810. The second portion 814 of the adhesive barrier wall 810 may be disposed on the second sidewall W2 of the contacts 250. Compared to the second portion 504 of the adhesive barrier wall 500 in FIG. 7 which can extend to the fourth sidewall W4 of the light emitting element 230, the second portion 814 of the adhesive barrier wall 810 in FIG. 8 may range between the second sidewall W2 of the contacts 250 and the fourth sidewall W4 of the light emitting element 230.

In some other embodiments, the first laser 400 used in operation 104 may be applied in a different way, such as different irradiation positions or area sizes, to form a different display device, as elaborated in the following descriptions.

Figure 9:
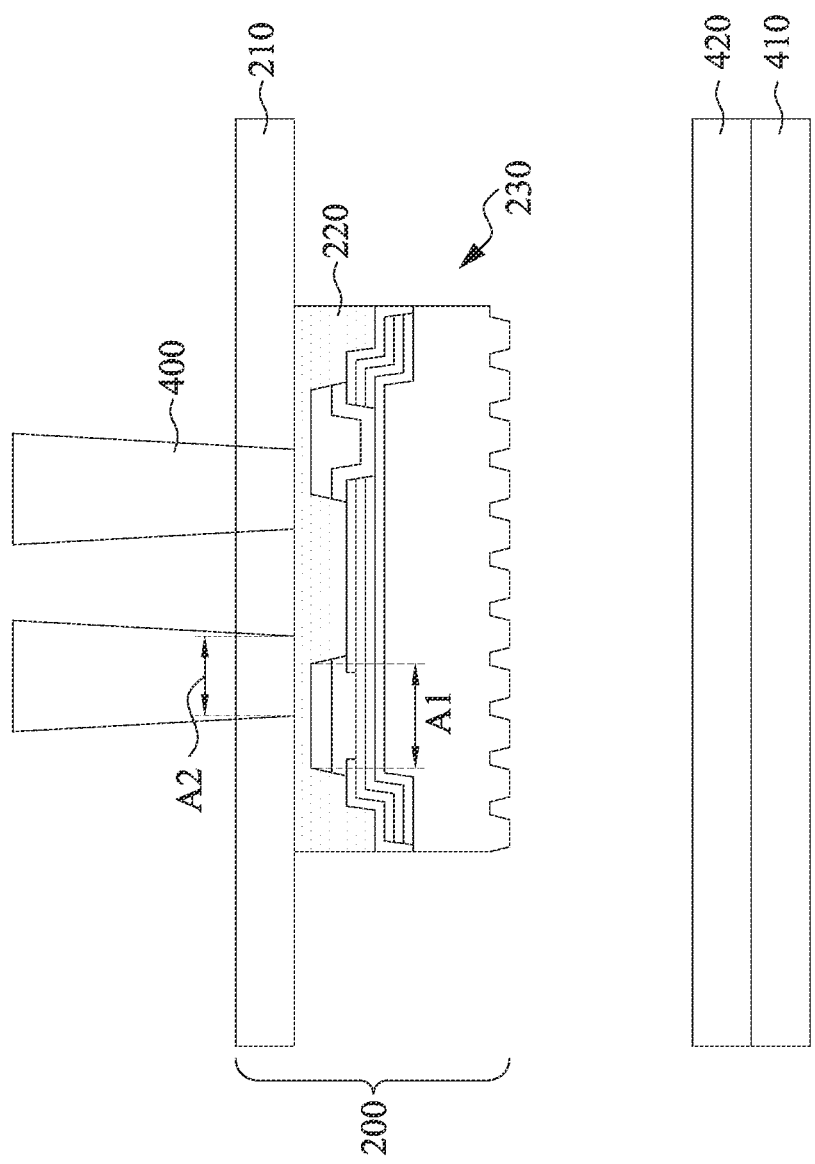
FIG. 9 is a cross-sectional view of one of operation stages in a method of fabricating a display device, in accordance with some other embodiments.

Referring to FIGS. 9, 10A and 10B, FIG. 9 is a cross-sectional view of one of operation stages in the method 100 of fabricating a display device in accordance with some other embodiments, FIG. 10A is a cross-sectional view of one of operation stages in the method 100 of fabricating a display device in accordance with some other embodiments, and FIG. 10B is a top view of the light emitting element 230 illustrated in FIG. 10A in accordance with some embodiments. In FIG. 10B, exemplary positions where the first contact 250A and the second contact 250B are disposed are illustrated with the broken lines. In addition, the transferring device 200 with the patterned adhesive layer 220 illustrated in FIGS. 2A and 2B is employed in FIGS. 9, 10A and 10B for an exemplary description.

Similar to FIG. 4, the first laser 400 used in the first laser process may pass through the first substrate 210 and irradiate the patterned adhesive layer 220. The first laser 400 may include multiple irradiation areas A2 on the patterned adhesive layer 220. The irradiation areas A2 may not overlap each other. That is, the irradiation areas A2 may be spaced apart from each other. In some embodiments, single irradiation area A2 of the first laser 400 may be smaller than the area A1 of individual contact 250. It is understood that an irradiation position in FIG. 9 can be deviated from an irradiation position in FIG. 4, so a resulted position of an opening O2 (see FIGS. 10A and 10B) can be different from a position of the opening O1 (see FIGS. 5A and 5B).

In addition to the function of detaching and transferring, the removal of a portion of the patterned adhesive layer 220 by the first laser process with the first laser 400 can concurrently provide the function of patterning the patterned adhesive layer 220 such that an adhesive barrier wall 1000 is formed. In other words, after the first laser process with the first laser 400, the patterned adhesive layer 220 may become the adhesive barrier wall 1000.

The adhesive barrier wall 1000 may include the opening O2 having the area A3, and the opening O2 can be resulted from the removal of a portion of the patterned adhesive layer 220 by the first laser process with the first laser 400. In some embodiments, the area A3 of the opening O2 can be substantially same as the single irradiation area A2. In some embodiments, the area A3 of the opening O2 can be smaller than the single irradiation area A2. Further, the first contact 250A and the second contact 250B are respectively exposed from the opening O2. In some embodiments as illustrated in FIGS. 10A and 10B, one portion of the opening O2 is located within the contacts 250, and the other portion of the opening O2 is located on a first portion 1002 of the adhesive barrier wall 1000.

The adhesive barrier wall 1000 may substantially equals to the adhesive barrier wall 500 (see FIGS. 5A and 5B) except the opening O2. The adhesive barrier wall 1000 may be disposed on the first surface S1 of the light emitting element 230. The adhesive barrier wall 1000 may include the first portion 1002 and a second portion 1004. The first portion 1002 may be disposed between the adjacent contacts 250 of the light emitting element 230. For example, the first portion 1002 of the adhesive barrier wall 1000 may physically contact the first contact 250A and the second contact 250B, as illustrated in FIG. 10A. In some embodiments, a lateral space between the first sidewall W1 of the first contact 250A and the first sidewall W1 of the second contact 250B may be entirely filled with the first portion 1002 of the adhesive barrier wall 1000. The second portion 1004 of the adhesive barrier wall 1000 may be disposed on the second sidewall W2 of the contacts 250.

In some embodiments, the adhesive barrier wall 1000 may physically contact the first surface S1 of the light emitting element 230 as well as the contacts 250 disposed on the first surface S1. Specifically speaking, the adhesive barrier wall 1000 may physically contact and cover the second surface S2, the first sidewall W1 and the second sidewall W2 of the contacts 250. In another words, the length L1 between the second surface S2 of the contacts 250 and the first surface S1 of the light emitting element 230 may be smaller than a length L4 between a fifth surface S5 of the first portion 1002 and the first surface S1 of the light emitting element 230. In some embodiments, the second portion 1004 of the adhesive barrier wall 1000 may physically contact and cover sidewall of the light emitting element 230, such as the third sidewall W3.

Figure 11:
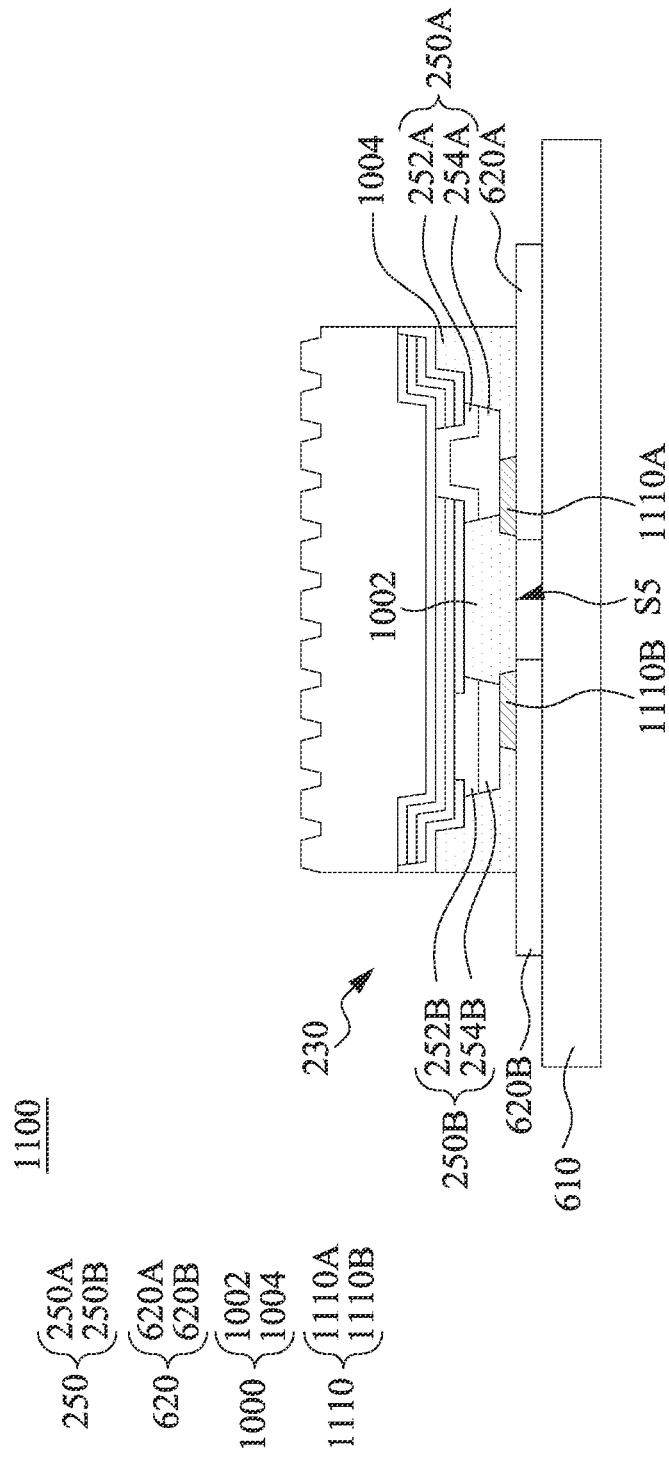
FIG. 11 is a cross-sectional view of one of operation stages in a method of fabricating a display device, in accordance with some other embodiments.

Referring to FIG. 11, FIG. 11 is a cross-sectional view of one of operation stages in the method 100 of fabricating a display device in accordance with some other embodiments. A structure in FIG. 10A can undergo the above-mentioned operation 106 and therefore no further description is elaborated again herein. After operation 106, a display device 1100 can be formed as illustrated in FIG. 11 and an IMC 1110 can be formed within a closed space (not illustrated). A formation of the closed space (not illustrated) may be due to the fact that the light emitting element 230 is disposed on the pads 620 of the array substrate 610, thereby turning the opening O2 to the closed space.

The display device 1100 in FIG. 11 may be similar to the display device 700 in FIG. 7 except a position of the IMC 1110. Although the position of the IMC 1110 can be deviated from a position of the IMC 710, yet the fifth surface S5 of the adhesive barrier wall 1000 still can physically contact the pads 620. Therefore, with the adhesive barrier wall 1000, the IMC 1110 may be formed between the contacts 250 of the light emitting element 230 and the pads 620 of the array substrate 610.

Similarly, the light emitting element 230 can be bonded to the array substrate 610 by the IMC 1110. In some embodiments, the IMC 1110 can electrically connect the light emitting element 230 and the pads 620 of the array substrate 610. In some embodiments, the closed space (not illustrated) can be filled with the IMC 1110. The adhesive barrier wall 1000 may make the IMC 1110 formed at a suitable position and perform a function of electrical connection as expected. For example, a first IMC 1110A may just electrically connect the first contact pad 254A of the light emitting element 230 and the first pad 620A of the array substrate 610. Similarly, a second IMC 1110B may just electrically connect the second contact pad 254B of the light emitting element 230 and the second pad 620B of the array substrate 610.

In some embodiments, the array substrate 610 may include a thin film transistor (TFT) substrate.

Figure 12:
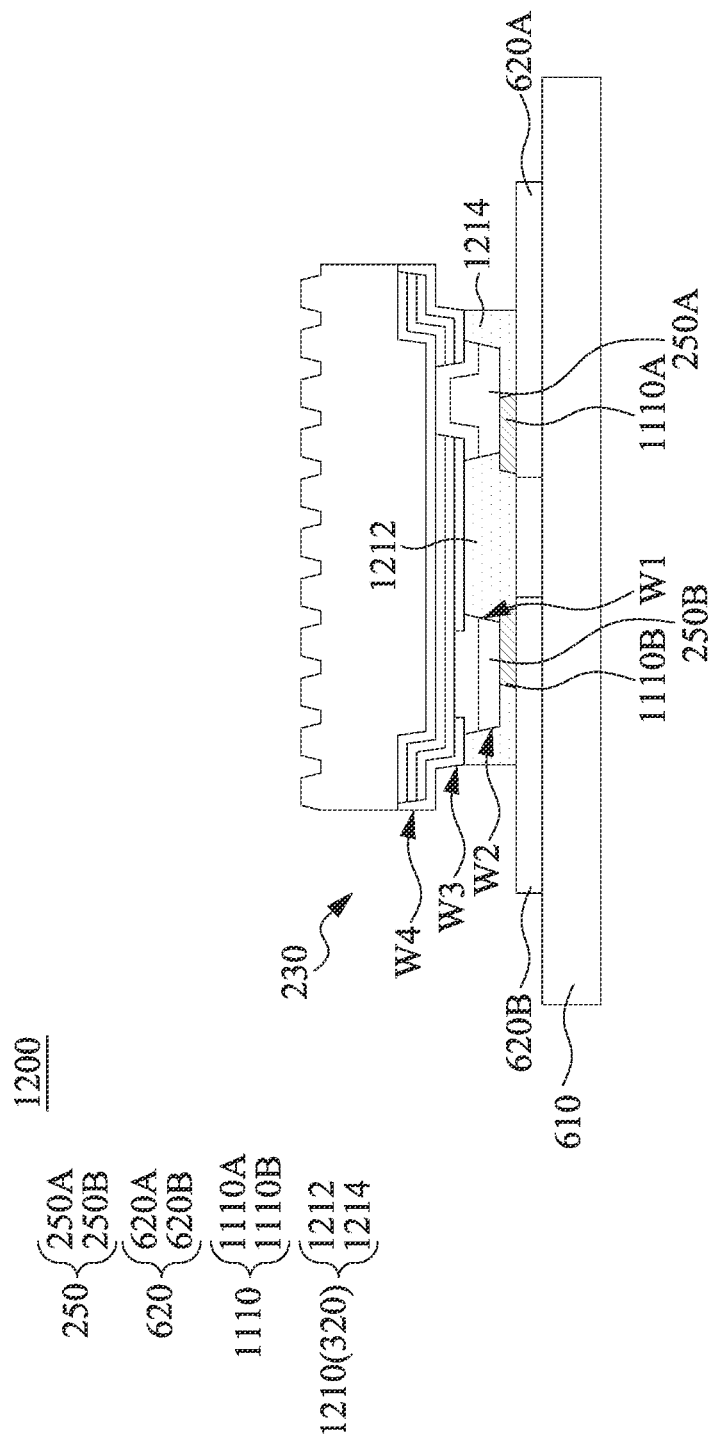
FIG. 12 is a cross-sectional view of one of operation stages in a method of fabricating a display device, in accordance with some other embodiments of FIG. 11.

Referring to FIG. 12, FIG. 12 is a cross-sectional view of one of operation stages in the method 100 of fabricating a display device in accordance with some other embodiments of FIG. 11. The transferring device 200 with the patterned adhesive layer 320 illustrated in FIGS. 3A and 3B is employed in FIG. 12 for an exemplary description. In another words, the patterned adhesive layer 320 can undergo operations 104 and 106, thereby forming a display device 1200 with an adhesive barrier wall 1210 in FIG. 12. The adhesive barrier wall 1210 can be formed from the patterned adhesive layer 320.

The display device 1200 in FIG. 12 is substantially same as the display device 1100 in FIG. 11. The only difference is that an extent of the adhesive barrier wall 1210 is smaller than an extent of the adhesive barrier wall 1000 (see FIG. 11).

The adhesive barrier wall 1210 may include a first portion 1212 and a second portion 1214. The first portion 1212 may be disposed between the adjacent contacts 250 of the light emitting element 230. For example, the first portion 1212 of the adhesive barrier wall 1210 may physically contact the first contact 250A and the second contact 250B, as illustrated in FIG. 12. In some embodiments, a lateral space between the first sidewall W1 of the first contact 250A and the first sidewall W1 of the second contact 250B may be entirely filled with the first portion 1212 of the adhesive barrier wall 1210. The second portion 1214 of the adhesive barrier wall 1210 may be disposed on the second sidewall W2 of the contacts 250. Compared to the second portion 1004 of the display device 1100 in FIG. 11 which can extend to the fourth sidewall W4 of the light emitting element 230, the second portion 1214 of the 1210 in FIG. 12 may range between the second sidewall W2 of the contacts 250 and the fourth sidewall W4 of the light emitting element 230.

Figure 13:
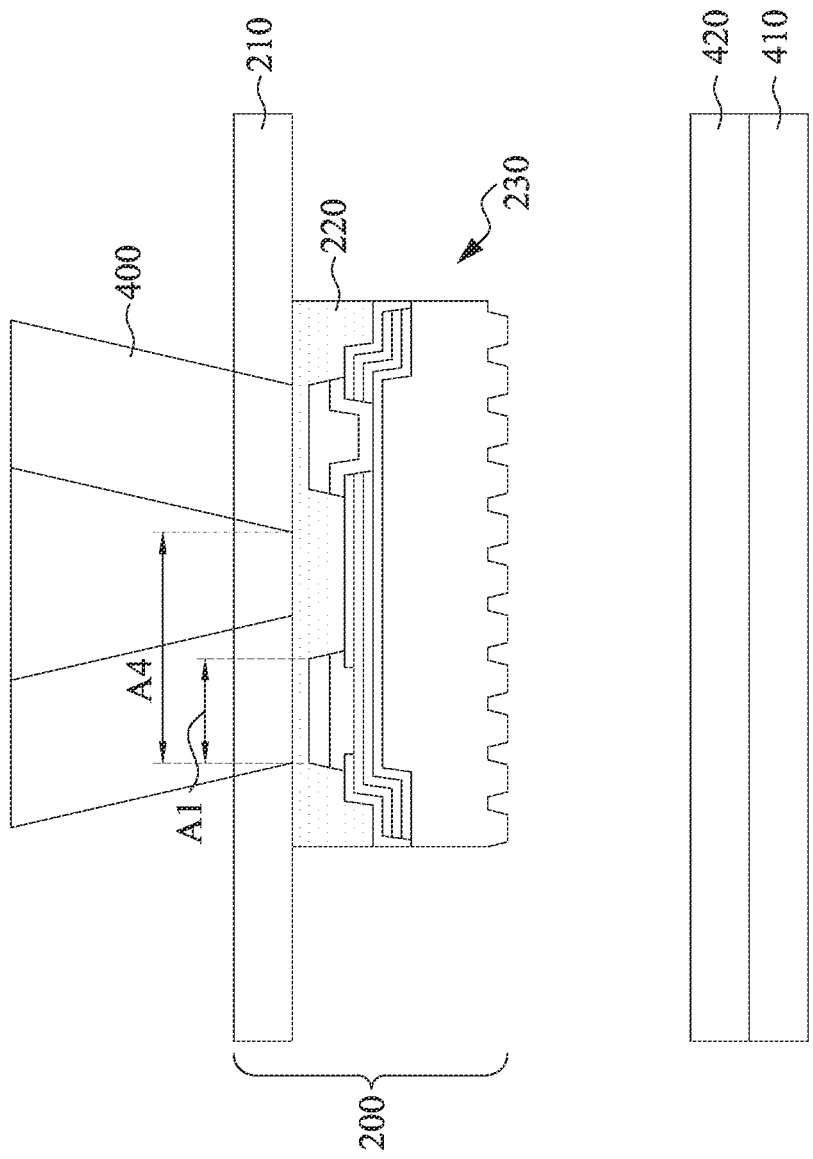
FIG. 13 is a cross-sectional view of one of operation stages in a method of fabricating a display device, in accordance with some other embodiments.

In some embodiments as illustrated in FIG. 13, the first laser 400 used in operation 104 (see FIG. 4) may be applied in a different way, such as different irradiation positions or area sizes, to form a different display device, as elaborated in the following descriptions.

Referring to FIGS. 13, 14A and 14B, FIG. 13 is a cross-sectional view of one of operation stages in the method 100 of fabricating a display device in accordance with some other embodiments, FIG. 14A is a cross-sectional view of one of operation stages in the method 100 of fabricating a display device in accordance with some other embodiments, and FIG. 14B is a top view of the light emitting element 230 illustrated in FIG. 10A in accordance with some embodiments. In FIG. 14B, exemplary positions where the first contact 250A and the second contact 250B are disposed are illustrated with the broken lines. In addition, the transferring device 200 with the patterned adhesive layer 220 illustrated in FIGS. 2A and 2B is employed in FIGS. 13, 14A and 14B for an exemplary description.

Similar to FIG. 4, the first laser 400 used in the first laser process may pass through the first substrate 210 and irradiate the patterned adhesive layer 220. The first laser 400 may include multiple irradiation areas A4 on the patterned adhesive layer 220. The irradiation areas A4 may partly overlap each other. It is understood that a size of irradiation areas A4 in FIG. 13 can be larger than a size of the irradiation areas A2 in FIG. 4, so the irradiation areas A4 can cover at least two of the contacts 250 and a portion of the patterned adhesive layer 220 between the contacts 250.

In addition to the function of detaching and transferring, the removal of a portion of the patterned adhesive layer 220 by the first laser process with the first laser 400 can concurrently provide the function of patterning the patterned adhesive layer 220 such that an adhesive barrier wall 1400 is formed. In another words, after the first laser process with the first laser 400, the patterned adhesive layer 220 may become the adhesive barrier wall 1400. The adhesive barrier wall 1400 can include a first portion 1402 and a second portion 1404. In some embodiments, the first portion 1402 of the adhesive barrier wall 1400 may be removed by the first laser 400 with parameters adjusted, such as wave phase of laser beams. Therefore, the adhesive barrier wall 1400 further includes a subportion 1406 disposed between the first sidewalls W1 of the contacts 250 and on the second surface S2 of the contacts 250. The subportion 1406 may include a first subportion 1406A and a second subportion 1406B respectively protruding from the first portion 1402. As illustrated in FIG. 14, the first portion 1402 and the subportion 1406 may collectively be a recessed shape.

The adhesive barrier wall 1400 may include an opening O3 having the area A5, and the opening O3 can be resulted from the removal of a portion of the patterned adhesive layer 220 by the first laser process with the first laser 400. In some embodiments, the area A5 of the opening O3 can be smaller than the single irradiation area A4. Further, the first contact 250A and the second contact 250B are exposed from the opening O3. In some embodiments as illustrated in FIGS. 14A and 14B, the opening O3 can be located within the contacts 250.

The adhesive barrier wall 1400 may be disposed on the first surface S1 of the light emitting element 230. The adhesive barrier wall 1400 may include the first portion 1402 and the second portion 1404. The first portion 1402 may be disposed between the adjacent contacts 250 of the light emitting element 230. For example, the first portion 1402 of the adhesive barrier wall 1400 may physically contact the first contact 250A and the second contact 250B, as illustrated in FIG. 14A. In some embodiments, a lateral space between the first sidewall W1 of the first contact 250A and the first sidewall W1 of the second contact 250B may be connected by the first portion 1402 of the adhesive barrier wall 1400. In some embodiments, the first subportion 1406A can abut the first contact 250A, and the second subportion 1406B can abut the second contact 250B. The second portion 1404 of the adhesive barrier wall 1400 may be disposed on the second sidewall W2 of the contacts 250.

In some embodiments, the adhesive barrier wall 1400 may physically contact the first surface S1 of the light emitting element 230 as well as the contacts 250 disposed on the first surface S1. Specifically speaking, the adhesive barrier wall 1400 may physically contact and cover the second surface S2, the first sidewall W1 and the second sidewall W2 of the contacts 250. In another words, the length L1 between the second surface S2 of the contacts 250 and the first surface S1 of the light emitting element 230 may be smaller than a length L5 between a sixth surface S6 of the subportion 1406 of the adhesive barrier wall 1400 and the first surface S1 of the light emitting element 230. In some embodiments, the second portion 1404 of the adhesive barrier wall 1400 may physically contact and cover sidewall of the light emitting element 230, such as the third sidewall W3.

The adhesive barrier wall 1400 may be similar to the adhesive barrier wall 500 (see FIGS. 5A and 5B) except the opening O3 and the recessed shape formed by the first portion 1402 and the subportion 1406.

Figure 15:
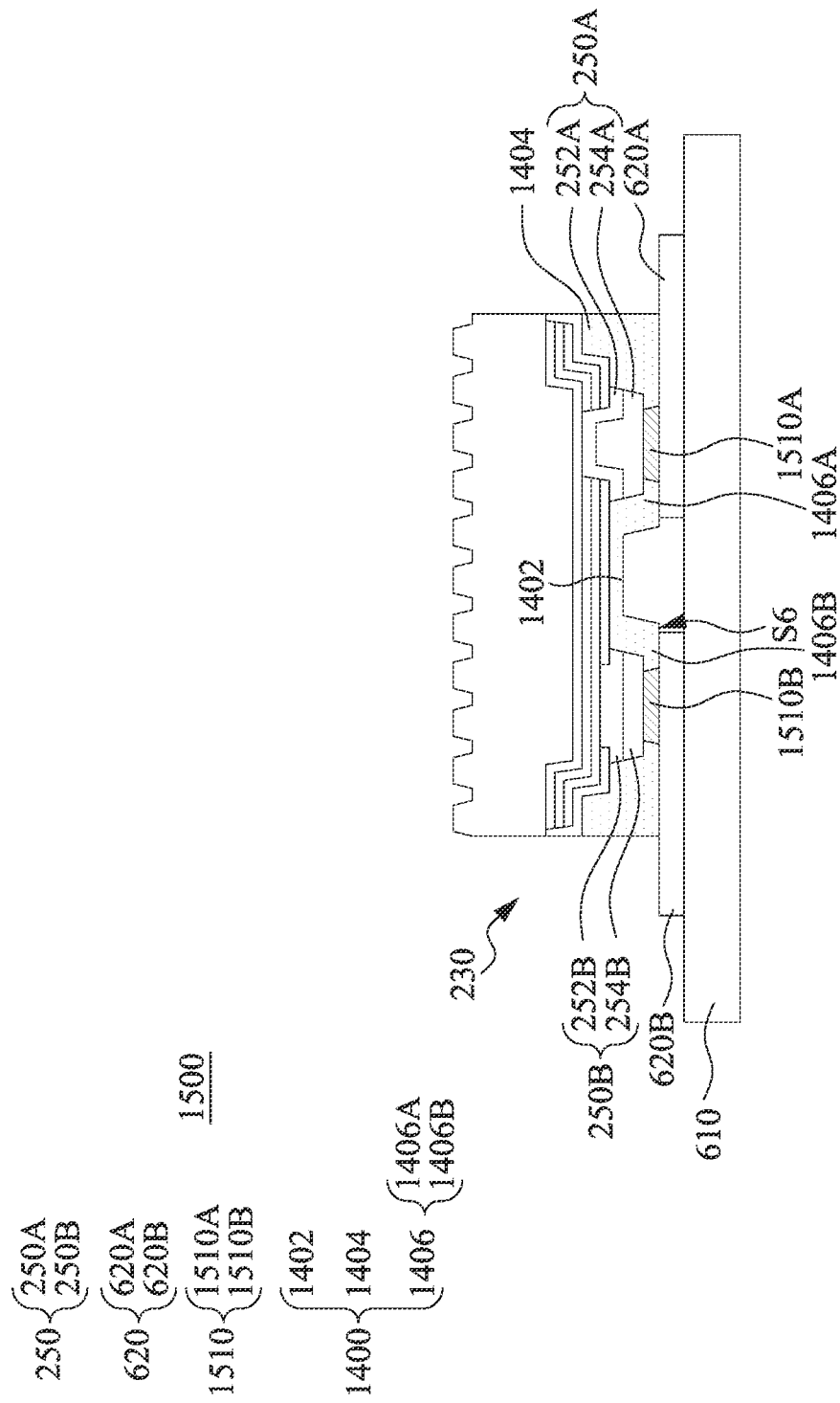
FIG. 15 is a cross-sectional view of one of operation stages in a method of fabricating a display device, in accordance with some other embodiments.

Referring to FIG. 15, FIG. 15 is a cross-sectional view of one of operation stages in the method 100 of fabricating a display device in accordance with some other embodiments. A structure in FIG. 14A can undergo the above-mentioned operation 106 and therefore no further description is elaborated again herein. After operation 106, a display device 1500 can be formed as illustrated in FIG. 15 and an IMC 1510 can be formed within a closed space (not illustrated). A formation of the closed space (not illustrated) may be due to the fact that the light emitting element 230 is disposed on the pads 620 of the array substrate 610, thereby turning the opening O3 to the closed space.

The display device 1500 in FIG. 15 may be similar to the display device 700 in FIG. 7. Although the first portion 1402 and the subportion 1406 may collectively be the recessed shape, yet the sixth surface S6 of the subportion 1406 still can physically contact the pads 620. Therefore, with the adhesive barrier wall 1400, the IMC 1510 may be formed between the contacts 250 of the light emitting element 230 and the pads 620 of the array substrate 610.

Similarly, the light emitting element 230 can be bonded to the array substrate 610 by the IMC 1510. In some embodiments, the IMC 1510 can electrically connect the light emitting element 230 and the pads 620 of the array substrate 610. In some embodiments, the closed space (not illustrated) can be filled with the IMC 1510. The adhesive barrier wall 1400 may make the IMC 1510 formed at a suitable position and perform a function of electrical connection as expected. For example, a first IMC 1510A may just electrically connect the first contact pad 254A of the light emitting element 230 and the first pad 620A of the array substrate 610. Similarly, a second IMC 1510B may just electrically connect the second contact pad 254B of the light emitting element 230 and the second pad 620B of the array substrate 610.

Figure 16:
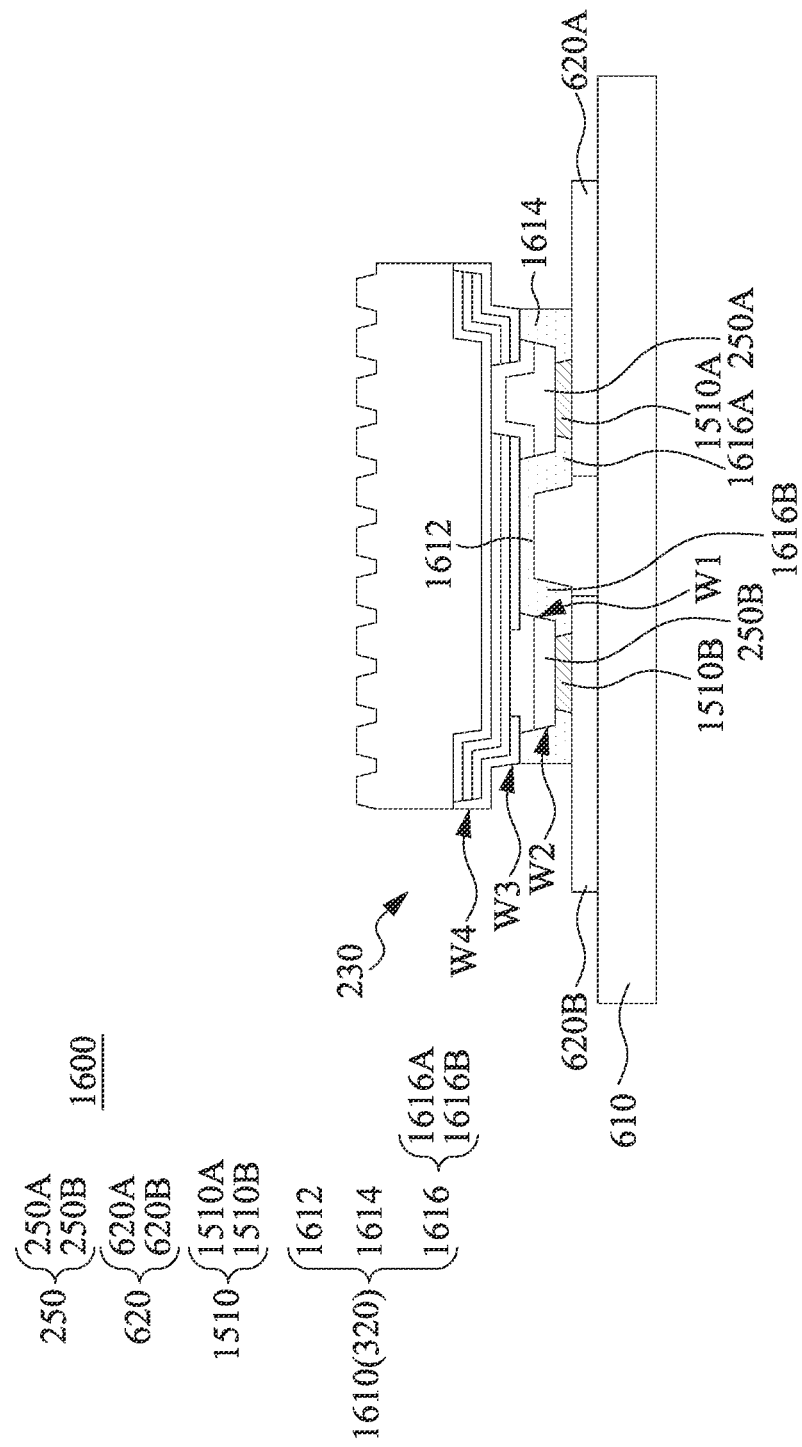
FIG. 16 is a cross-sectional view of one of operation stages in a method of fabricating a display device, in accordance with some other embodiments of FIG. 15.

Referring to FIG. 16, FIG. 16 is a cross-sectional view of one of operation stages in the method 100 of fabricating a display device in accordance with some other embodiments of FIG. 15. The transferring device 200 with the patterned adhesive layer 320 illustrated in FIGS. 3A and 3B is employed in FIG. 16 for an exemplary description. In another words, the patterned adhesive layer 320 can undergo operations 104 and 106, thereby forming a display device 1600 with an adhesive barrier wall 1610 in FIG. 16. The adhesive barrier wall 1610 can be formed from the patterned adhesive layer 320.

The display device 1600 in FIG. 16 is substantially same as the display device 1500 in FIG. 15. The only difference is that an extent of the adhesive barrier wall 1610 is smaller than an extent of the adhesive barrier wall 1400 (see FIG. 15).

The adhesive barrier wall 1610 may include a first portion 1612 and a second portion 1614. The first portion 1612 may be disposed between the adjacent contacts 250 of the light emitting element 230. The adhesive barrier wall 1610 may further include a subportion 1616 disposed between the first sidewalls W1 of the contacts 250 and on the second surface S2 of the contacts 250. The subportion 1616 may include a first subportion 1616A and a second subportion 16168 respectively protruding from the first portion 1612.

In some embodiments, a lateral space between the first sidewall W1 of the first contact 250A and the first sidewall W1 of the second contact 250B may be connected by the first portion 1612 of the adhesive barrier wall 1610. In some embodiments, the first subportion 1616A can abut the first contact 250A, and the second subportion 1616B can abut the second contact 250B. The second portion 1614 of the adhesive barrier wall 1610 may be disposed on the second sidewall W2 of the contacts 250. Compared to the second portion 1404 of the adhesive barrier wall 1400 in FIG. 15 which can extend to the fourth sidewall W4 of the light emitting element 230, the second portion 1614 of the adhesive barrier wall 1610 in FIG. 16 may range between the second sidewall W2 of the contacts 250 and the fourth sidewall W4 of the light emitting element 230.

Figure 17:
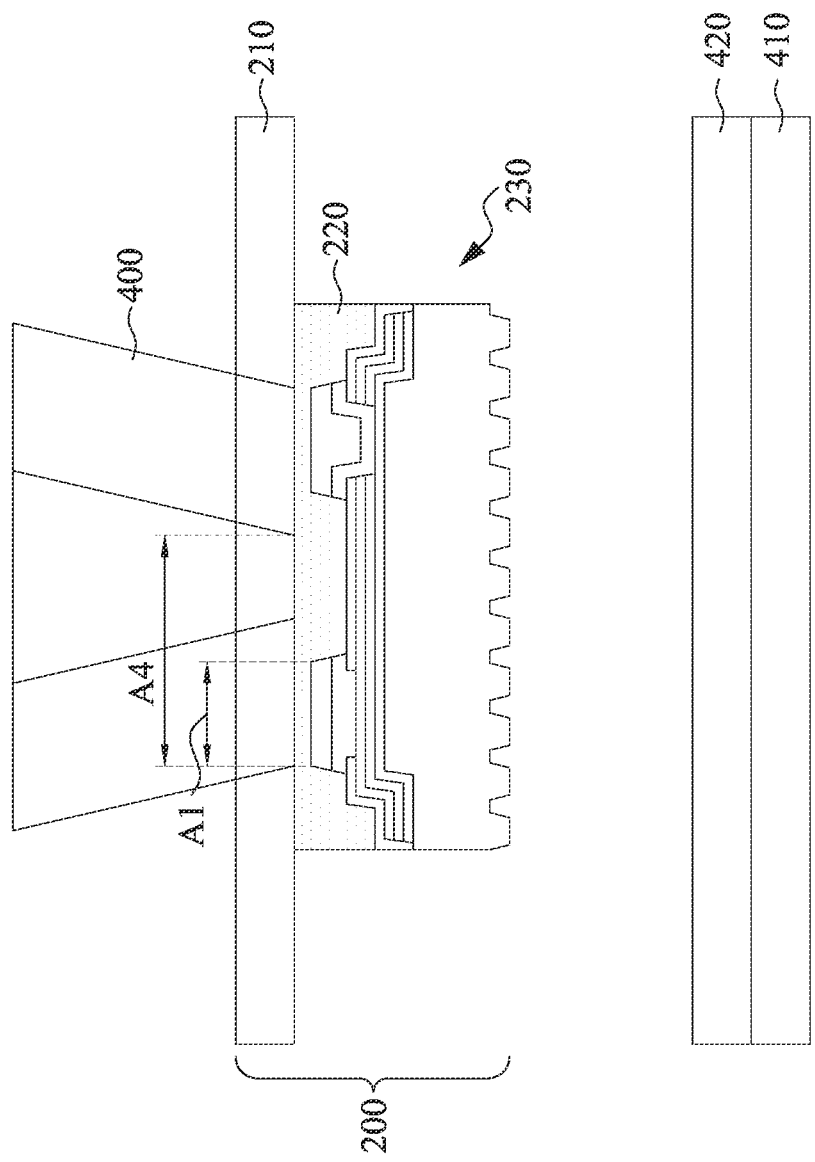
FIG. 17 is a cross-sectional view of one of operation stages in a method of fabricating a display device, in accordance with some other embodiments.

In some embodiments as illustrated in FIG. 17, the first laser 400 used in operation 104 (see FIG. 4) may be applied in a different way, such as different irradiation positions or area sizes, to form a different display device, as elaborated in the following descriptions.

Figure 18A:
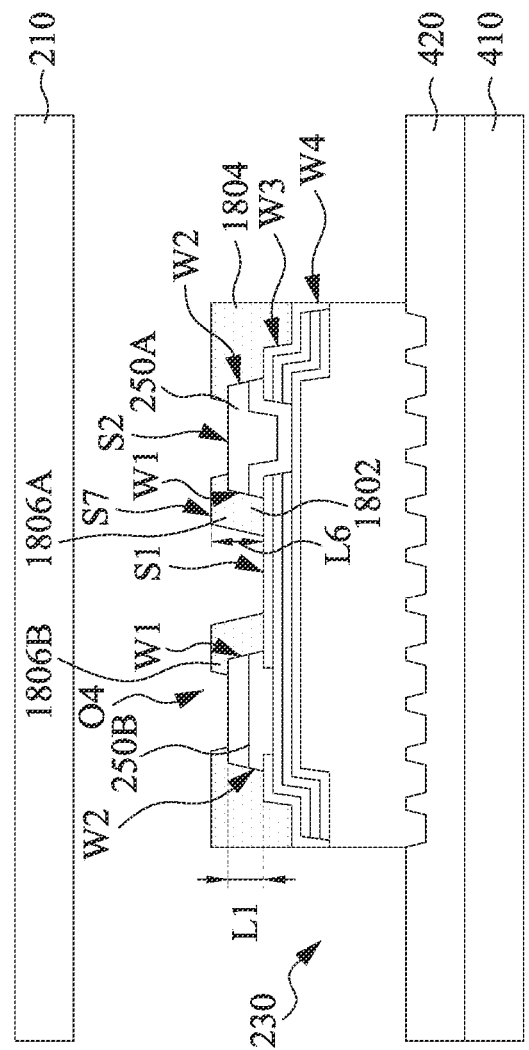
FIG. 18A is a cross-sectional view of one of operation stages in a method of fabricating a display device, in accordance with some other embodiments.
Figure 18B:
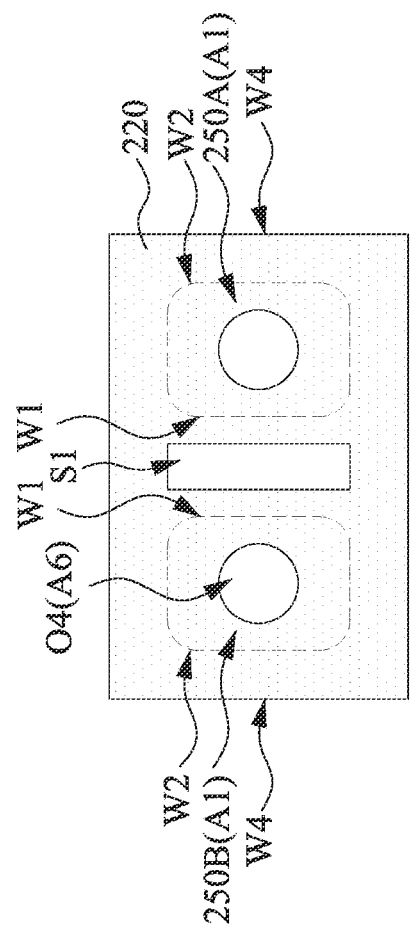
FIG. 18B is a top view of a light emitting element illustrated in FIG. 18A, in accordance with some embodiments.

Referring to FIGS. 17, 18A and 18B, FIG. 17 is a cross-sectional view of one of operation stages in the method 100 of fabricating a display device in accordance with some other embodiments, FIG. 18A is a cross-sectional view of one of operation stages in the method 100 of fabricating a display device in accordance with some other embodiments, and FIG. 18B is a top view of the light emitting element 230 illustrated in FIG. 18A in accordance with some embodiments. In FIG. 18B, exemplary positions where the first contact 250A and the second contact 250B are disposed are illustrated with the broken lines. In addition, the transferring device 200 with the patterned adhesive layer 220 illustrated in FIGS. 2A and 2B is employed in FIGS. 17, 18A and 18B for an exemplary description.

An operation of the first laser 400 in FIG. 17 is similar to an operation of the first laser 400 in FIG. 13. In some embodiments, a first portion 1802 of an adhesive barrier wall 1800 may further be removed by the first laser 400 with parameters adjusted, such as wave phase of laser beams, to expose the first surface S1 of the light emitting element 230. The adhesive barrier wall 1800 in FIGS. 18A and 18B are similar to the adhesive barrier wall 1800 in FIGS. 14A and 14B.

The adhesive barrier wall 1800 may include an opening O4 having the area A6, and the opening O4 can be resulted from the removal of a portion of the patterned adhesive layer 220 by the first laser process with the first laser 400. In some embodiments, the area A6 of the opening O4 can be smaller than the single irradiation area A4. Further, the first contact 250A and the second contact 250B are exposed from the opening O4. In some embodiments as illustrated in FIGS. 18A and 18B, the opening O4 can be located within the contacts 250.

The residual first portion 1802 may be disposed between the adjacent contacts 250 of the light emitting element 230. For example, the first portion 1802 of the adhesive barrier wall 1800 may physically contact the first contact 250A and the second contact 250B. In some embodiments, a first subportion 1806A can abut the first contact 250A, and a second subportion 1806B can abut the second contact 250B. A second portion 1804 of the adhesive barrier wall 1800 may be disposed on the second sidewall W2 of the contacts 250.

In some embodiments, the adhesive barrier wall 1800 may physically contact the first surface S1 of the light emitting element 230 as well as the contacts 250 disposed on the first surface S1. Specifically speaking, the adhesive barrier wall 1800 may physically contact and cover the second surface S2, the first sidewall W1 and the second sidewall W2 of the contacts 250. In another words, the length L1 between the second surface S2 of the contacts 250 and the first surface S1 of the light emitting element 230 may be smaller than a length L6 between a seventh surface S7 of the subportion 1806 of the adhesive barrier wall 1800 and the first surface S1 of the light emitting element 230. In some embodiments, the second portion 1804 of the adhesive barrier wall 1800 may physically contact and cover sidewall of the light emitting element 230, such as the third sidewall W3.

Figure 19:
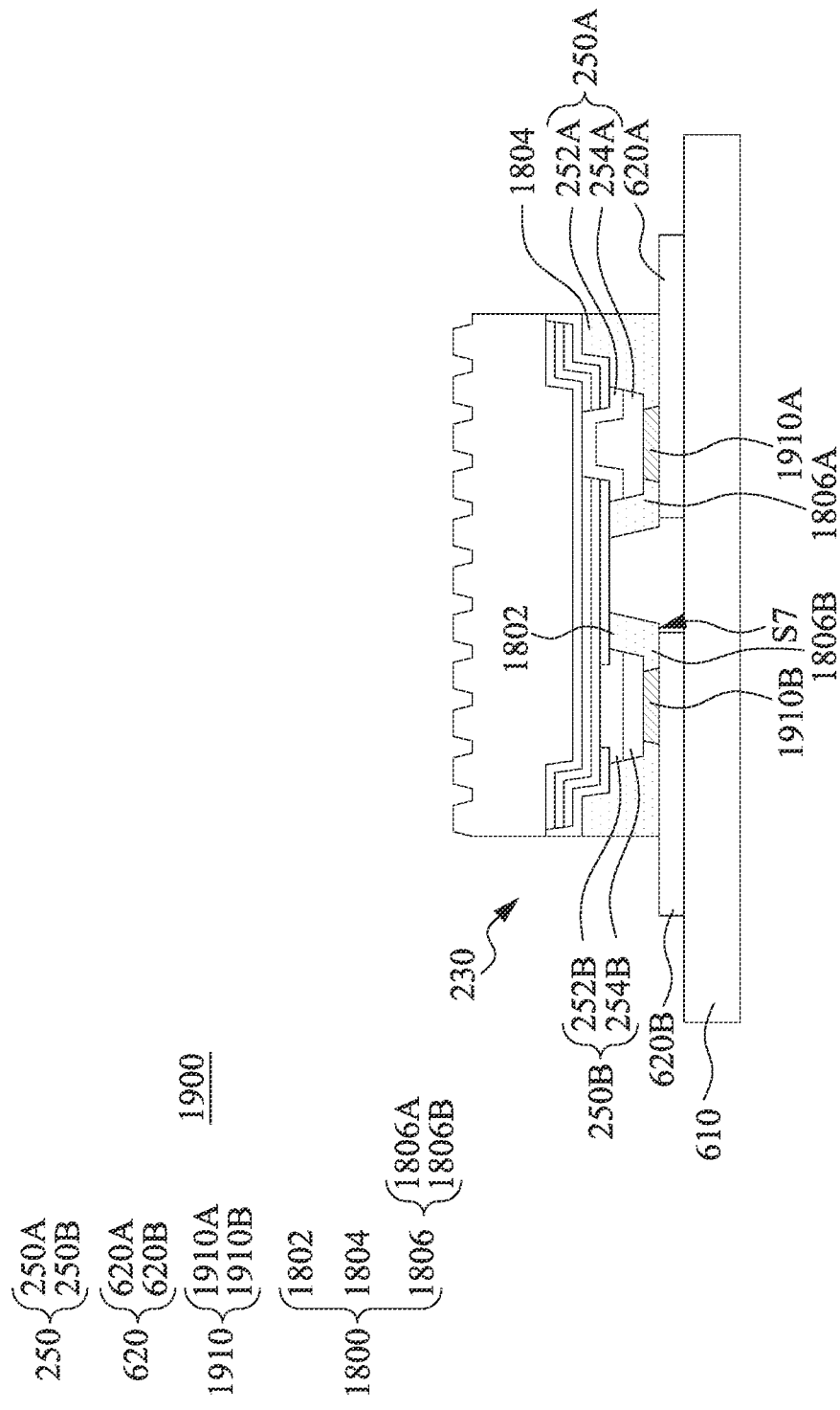
FIG. 19 is a cross-sectional view of one of operation stages in a method of fabricating a display device, in accordance with some other embodiments.

Referring to FIG. 19, FIG. 19 is a cross-sectional view of one of operation stages in the method 100 of fabricating a display device in accordance with some other embodiments. A structure in FIG. 18A can undergo the above-mentioned operation 106 and therefore no further description is elaborated again herein. After operation 106, a display device 1900 can be formed as illustrated in FIG. 19 and an IMC 1910 can be formed within a closed space (not illustrated). A formation of the closed space (not illustrated) may be due to the fact that the light emitting element 230 is disposed on the pads 620 of the array substrate 610, thereby turning the opening O4 to the closed space.

The display device 1900 in FIG. 19 may be similar to the display device 1500 in FIG. 15. Although the first portion 1802 of the adhesive barrier wall 1800 can be partly removed, yet the seventh surface S7 of the subportion 1806 still can physically contact the pads 620. Therefore, with the adhesive barrier wall 1800, the IMC 1910 may be formed between the contacts 250 of the light emitting element 230 and the pads 620 of the array substrate 610.

Similarly, the light emitting element 230 can be bonded to the array substrate 610 by the IMC 1910. In some embodiments, the IMC 1910 can electrically connect the light emitting element 230 and the pads 620 of the array substrate 610. In some embodiments, the closed space (not illustrated) can be filled with the IMC 1910. The adhesive barrier wall 1800 may make the IMC 1910 formed at a suitable position and perform a function of electrical connection as expected. For example, a first IMC 1910A may just electrically connect the first contact pad 254A of the light emitting element 230 and the first pad 620A of the array substrate 610. Similarly, a second IMC 19108 may just electrically connect the second contact pad 254B of the light emitting element 230 and the second pad 620B of the array substrate 610.

Figure 20:
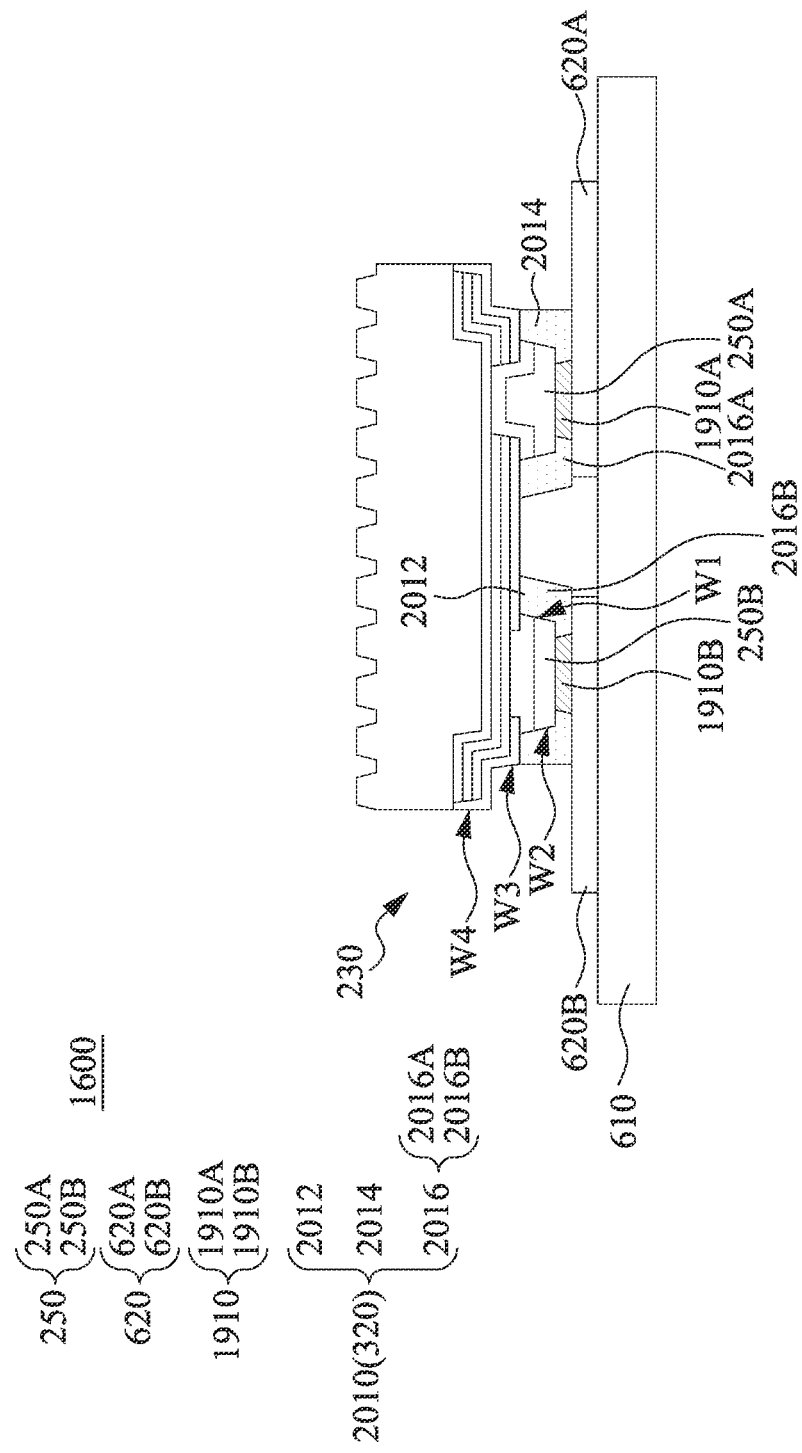
FIG. 20 is a cross-sectional view of one of operation stages in a method of fabricating a display device, in accordance with some other embodiments of FIG. 19.

Referring to FIG. 20, FIG. 20 is a cross-sectional view of one of operation stages in the method 100 of fabricating a display device in accordance with some other embodiments of FIG. 19. The transferring device 200 with the patterned adhesive layer 320 illustrated in FIGS. 3A and 3B is employed in FIG. 20 for an exemplary description. In another words, the patterned adhesive layer 320 can undergo operations 104 and 106, thereby forming a display device 2000 with an adhesive barrier wall 2010 in FIG. 20. The adhesive barrier wall 2010 can be formed from the patterned adhesive layer 320.

The display device 2000 in FIG. 20 is substantially same as the display device 1900 in FIG. 19. The only difference is that an extent of the adhesive barrier wall 2010 is smaller than an extent of the adhesive barrier wall 1800 (see FIG. 19). Compared to the second portion 1804 of the adhesive barrier wall 1800 in FIG. 19 which can extend to the fourth sidewall W4 of the light emitting element 230, a second portion 2014 of the adhesive barrier wall 2010 in FIG. 20 may range between the second sidewall W2 of the contacts 250 and the fourth sidewall W4 of the light emitting element 230.

Figure 21:
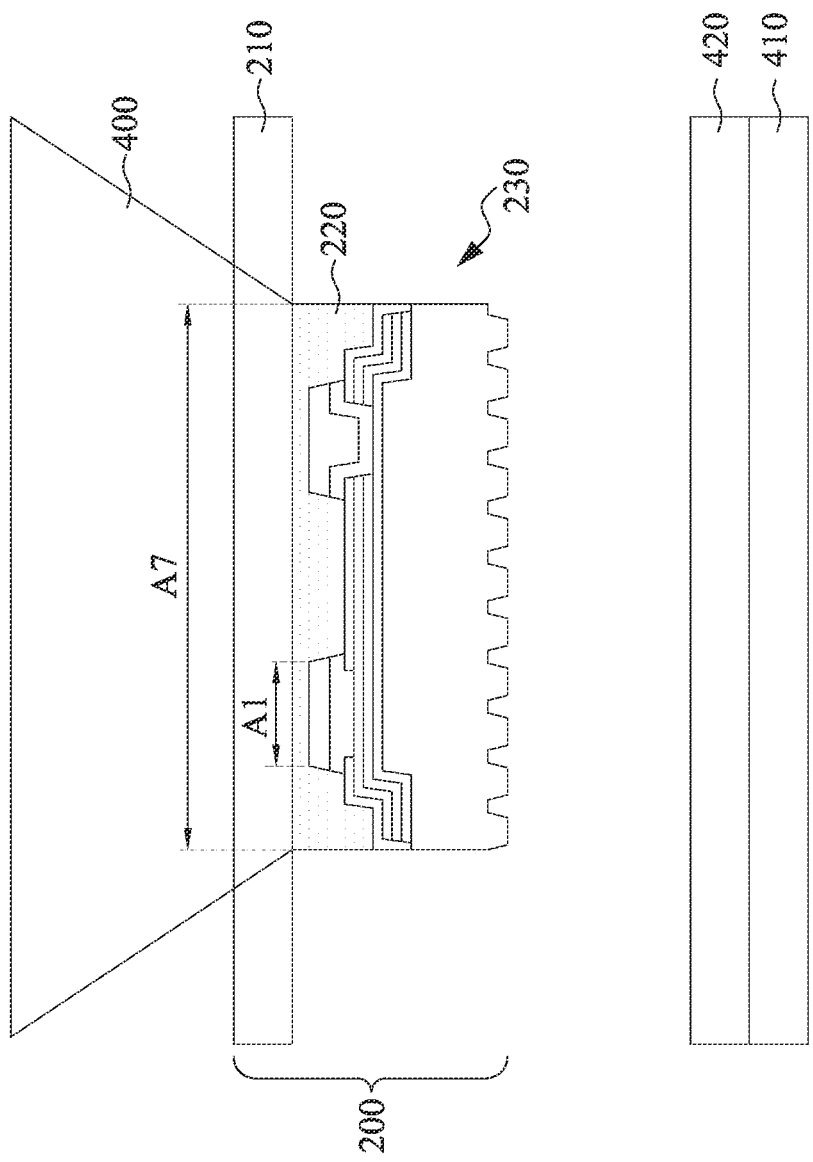
FIG. 21 is a cross-sectional view of one of operation stages in a method of fabricating a display device, in accordance with some other embodiments.

In some embodiments as illustrated in FIG. 21, the first laser 400 used in operation 104 (see FIG. 4) may be applied in a different way, such as different irradiation positions or area sizes, to form a different display device, as elaborated in the following descriptions.

Figure 22A:
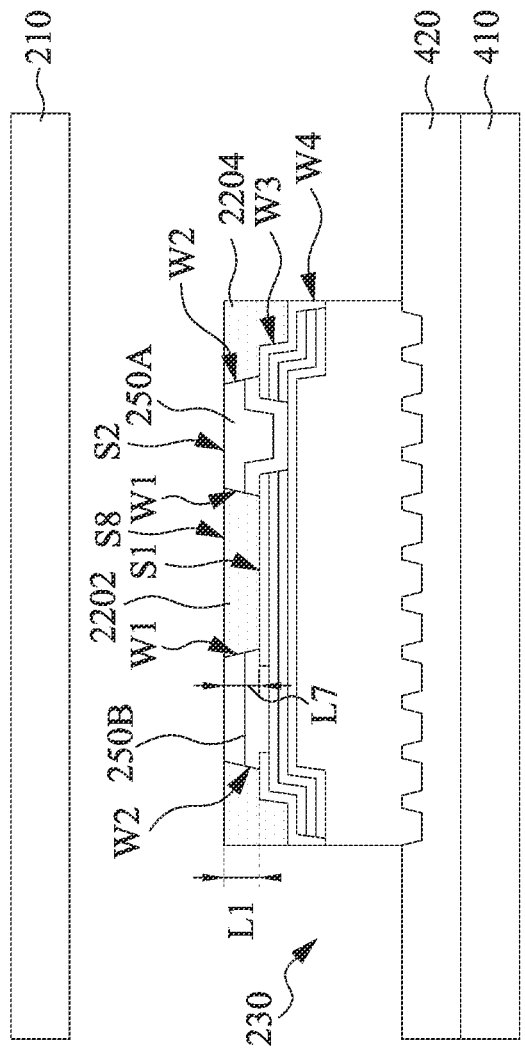
FIG. 22A is a cross-sectional view of one of operation stages in a method of fabricating a display device, in accordance with some other embodiments.
Figure 22B:
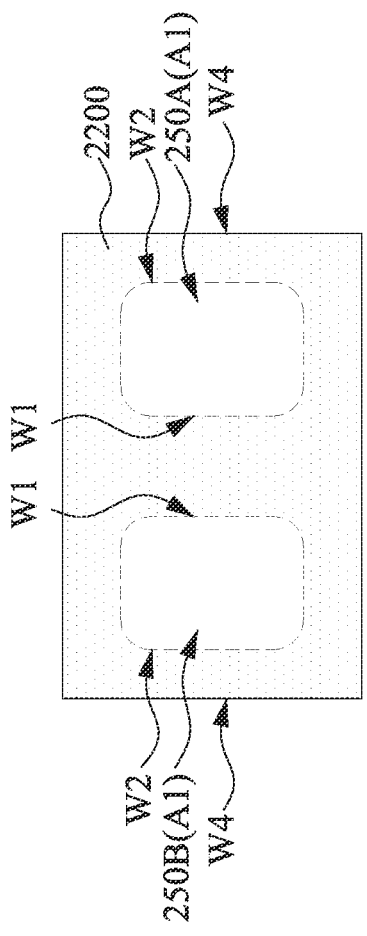
FIG. 22B is a top view of a light emitting element illustrated in FIG. 22A, in accordance with some embodiments.

Referring to FIGS. 21, 22A and 22B, FIG. 21 is a cross-sectional view of one of operation stages in the method 100 of fabricating a display device in accordance with some other embodiments, FIG. 22A is a cross-sectional view of one of operation stages in the method 100 of fabricating a display device in accordance with some other embodiments, and FIG. 22B is a top view of the light emitting element 230 illustrated in FIG. 22A in accordance with some embodiments. In FIG. 22B, exemplary positions where the first contact 250A and the second contact 250B are disposed are illustrated with the broken lines. In addition, the transferring device 200 with the patterned adhesive layer 220 illustrated in FIGS. 2A and 2B is employed in FIGS. 21, 22A and 22B for an exemplary description.

Similar to FIG. 4, the first laser 400 used in the first laser process may pass through the first substrate 210 and irradiate the patterned adhesive layer 220. The first laser 400 may include an irradiation area A7 on the patterned adhesive layer 220. The irradiation area A7 may cover the first contact 250A and the second contact 250B.

In addition to the function of detaching and transferring, the removal of a portion of the patterned adhesive layer 220 by the first laser process with the first laser 400 can concurrently provide the function of patterning the patterned adhesive layer 220 such that an adhesive barrier wall 2200 is formed. In another words, after the first laser process with the first laser 400, the patterned adhesive layer 220 may become the adhesive barrier wall 2200. An eighth surface S8 of the adhesive barrier wall 2200 can be coplanar with the second surface S2 of the contacts 250 by adjusting parameters of the first laser 400, such as adjusting laser intensity or irradiation duration.

The adhesive barrier wall 2200 can include a first portion 2202 and a second portion 2204. The first portion 2202 may be disposed between the adjacent contacts 250 of the light emitting element 230. For example, the first portion 2202 of the adhesive barrier wall 2200 may physically contact the first contact 250A and the second contact 250B, as illustrated in FIG. 22A. In some embodiments, a lateral space between the first sidewall W1 of the first contact 250A and the first sidewall W1 of the second contact 250B may be entirely filled with the first portion 2202 of the adhesive barrier wall 2200. The second portion 2204 of the adhesive barrier wall 2200 may be disposed on the second sidewall W2 of the contacts 250.

It is understood that because the eighth surface S8 of the adhesive barrier wall 2200 can be coplanar with the second surface S2 of the contacts 250, the adhesive barrier wall 2200 can physically contact the first sidewall W1 and the second sidewall W2 of the contacts 250 without covering the second surface S2 of the contacts 250. In another words, the length L1 between the second surface S2 of the contacts 250 and the first surface S1 of the light emitting element 230 may substantially equals to a length L7 between the eighth surface S8 of the adhesive barrier wall 2200 and the first surface S1 of the light emitting element 230. In some embodiments, the second portion 2204 of the adhesive barrier wall 2200 may physically contact and cover sidewall of the light emitting element 230, such as the third sidewall W3.

The adhesive barrier wall 2200 in FIGS. 22A and 22B may be substantially same as the adhesive barrier wall 500 in FIGS. 5A and 5B except no coverage on the contacts 250 by the adhesive barrier wall 2200 due to coplanarity.

Figure 23:
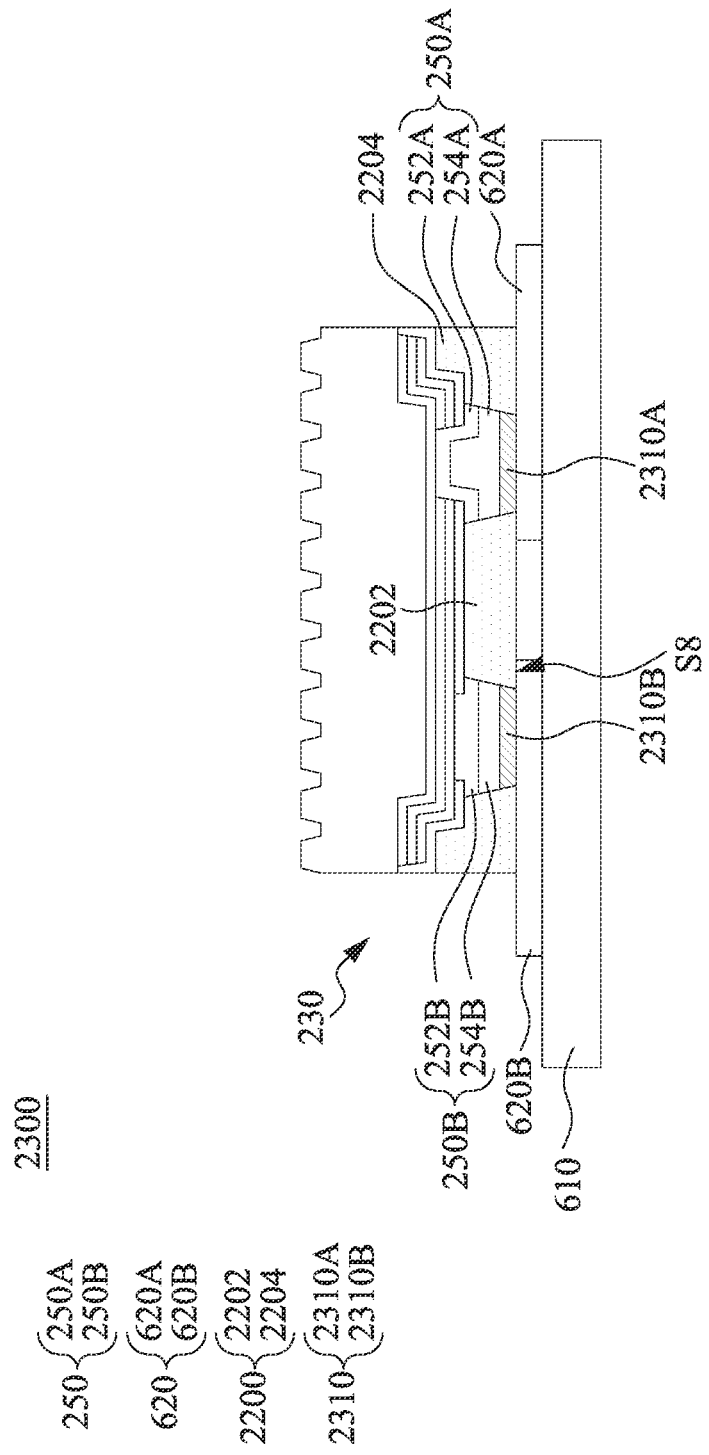
FIG. 23 is a cross-sectional view of one of operation stages in a method of fabricating a display device, in accordance with some other embodiments.

Referring to FIG. 23, FIG. 23 is a cross-sectional view of one of operation stages in the method 100 of fabricating a display device in accordance with some other embodiments. A structure in FIG. 22A can undergo the above-mentioned operation 106 and therefore no further description is elaborated again herein. After operation 106, a display device 2300 can be formed as illustrated in FIG. 23 and an IMC 2310 can be formed between the contacts 250 of the light emitting element 230 and the pads 620 of the array substrate 610.

The display device 2300 in FIG. 23 may be similar to the display device 700 in FIG. 7 except that the adhesive barrier wall 2200 may not cover the second surface S2 of the contacts 250 so the adhesive barrier wall 2200 may not be interposed between the contact pads 254 of the light emitting element 230 and the pads 620 of the array substrate 610. Because the eighth surface S8 of the adhesive barrier wall 2200 can physically contact the pads 620 of the array substrate 610, the IMC 2310 can be confined by the adhesive barrier wall 2200 and be formed between the contacts 250 of the light emitting element 230 and the pads 620 of the array substrate 610.

In some embodiments, the first contact pad 254A and the second contact pad 254B of the contacts 250 can absorb energy of a laser (e.g., the second laser 600) to increase temperature, such that a portion of the first contact pad 254A and the second contact pad 254B may be in a form of melted material (not illustrated). Despite no closed space formed by the adhesive barrier wall 2200, the flowable melted material (not illustrated) may in-situ react with the first pad 620A and second pad 620B of the second laser 600 to form the IMC 2310.

Similarly, the light emitting element 230 can be bonded to the array substrate 610 by the IMC 2310. In some embodiments, the IMC 2310 can electrically connect the light emitting element 230 and the pads 620 of the array substrate 610. The adhesive barrier wall 2200 may make the IMC 2310 formed at a suitable position and perform a function of electrical connection as expected. For example, a first IMC 2310A may just electrically connect the first contact pad 254A of the light emitting element 230 and the first pad 620A of the array substrate 610. Similarly, a second IMC 2310B may just electrically connect the second contact pad 254B of the light emitting element 230 and the second pad 620B of the array substrate 610.

Figure 24:
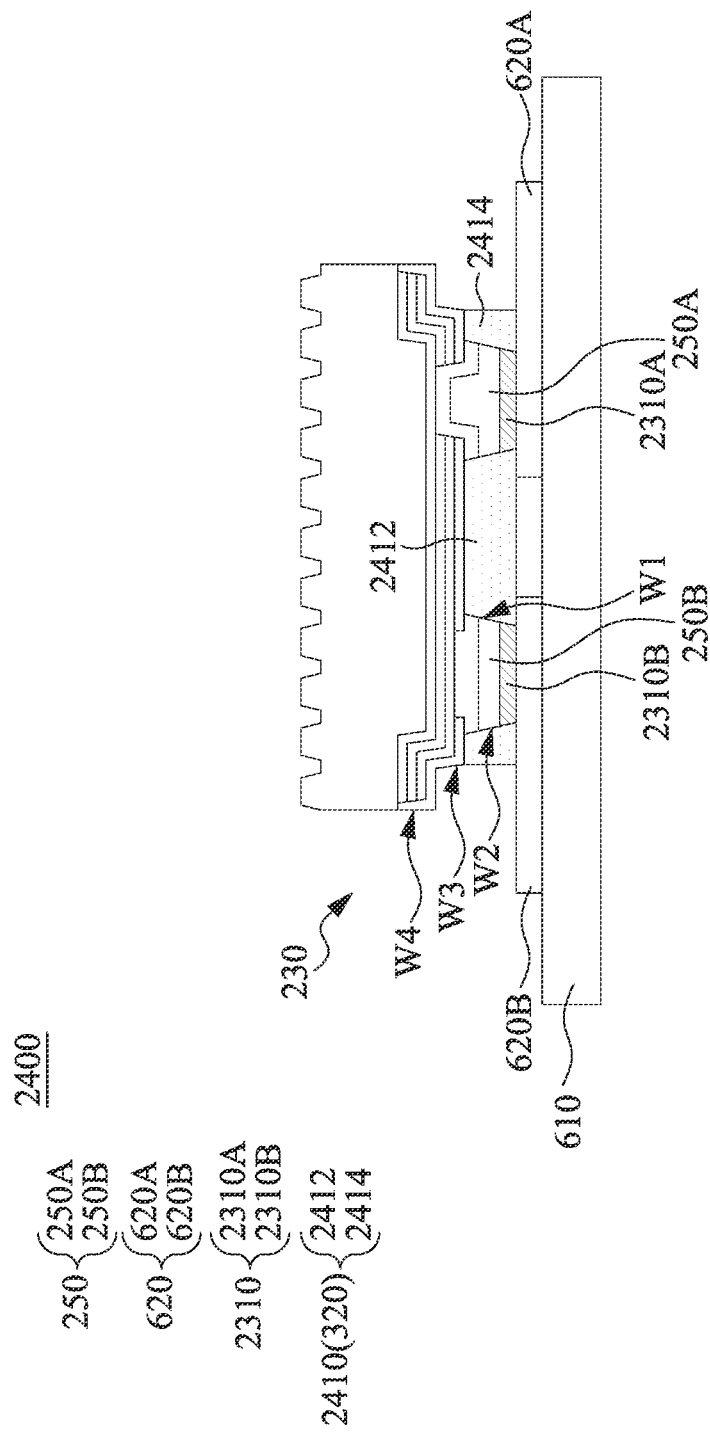
FIG. 24 is a cross-sectional view of one of operation stages in a method of fabricating a display device, in accordance with some other embodiments of FIG. 23.

Referring to FIG. 24, FIG. 24 is a cross-sectional view of one of operation stages in the method 100 of fabricating a display device in accordance with some other embodiments of FIG. 23. The transferring device 200 with the patterned adhesive layer 320 illustrated in FIGS. 3A and 3B is employed in FIG. 24 for an exemplary description. In another words, the patterned adhesive layer 320 can undergo operations 104 and 106, thereby forming a display device 2400 with an adhesive barrier wall 2410 in FIG. 24. The adhesive barrier wall 2410 can be formed from the patterned adhesive layer 320.

The display device 2400 in FIG. 24 is substantially same as the display device 2300 in FIG. 23. The only difference is that an extent of the adhesive barrier wall 2410 is smaller than an extent of the adhesive barrier wall 2200 (see FIG. 23). Compared to the second portion 2204 of the adhesive barrier wall 2200 in FIG. 23 which can extend to the fourth sidewall W4 of the light emitting element 230, a second portion 2414 of the adhesive barrier wall 2410 in FIG. 24 may range between the second sidewall W2 of the contacts 250 and the fourth sidewall W4 of the light emitting element 230.

Figure 25:
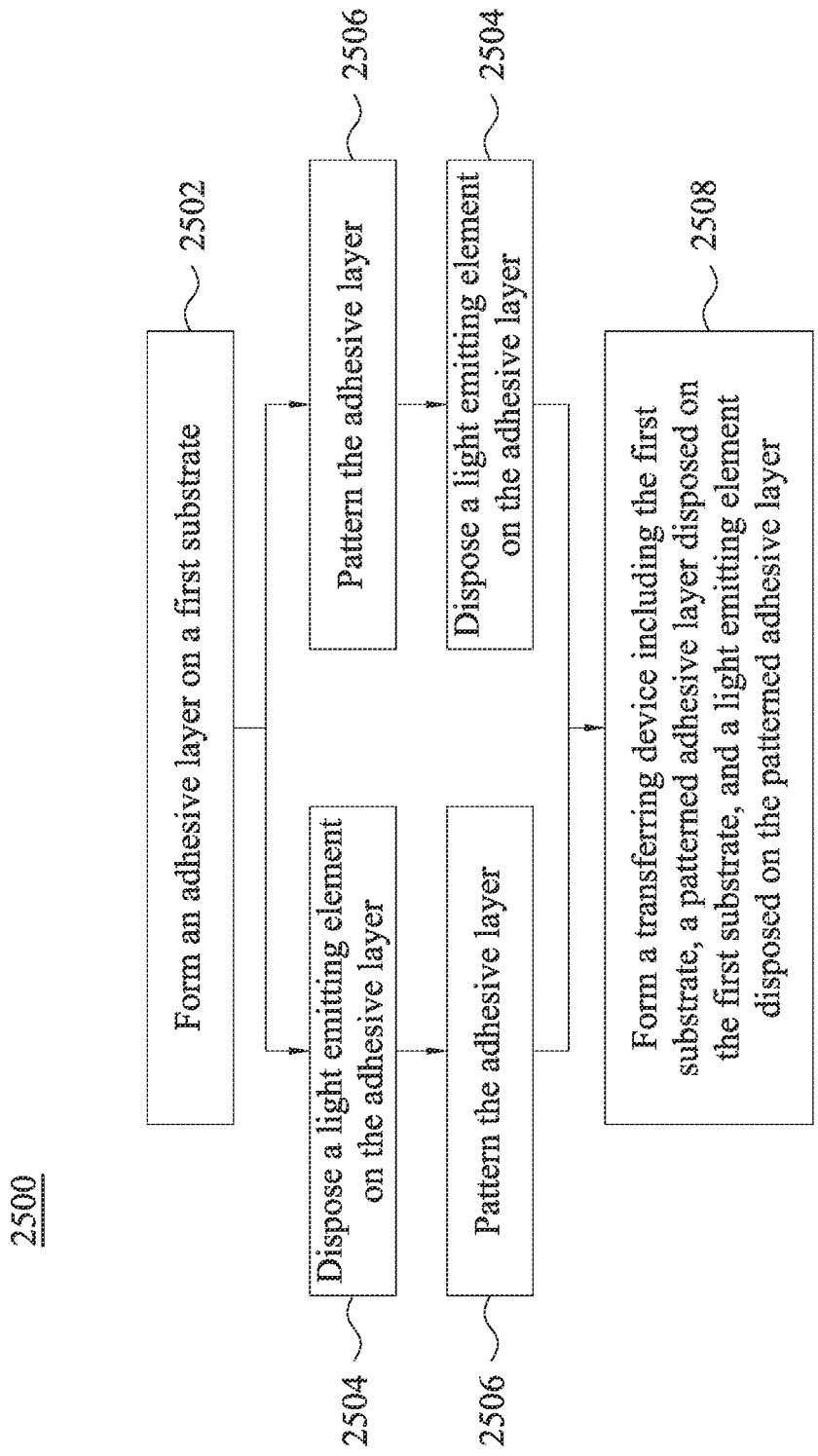
FIG. 25 is a flowchart of a method of fabricating a transferring device used in a fabrication of a display device, in accordance with some embodiments.

Referring to FIG. 25, the present disclosure further provides a method 2500 of forming an adhesive layer. That is, the method 2500 is performed before operation 102 of the method 100. It will be appreciated that the illustrated ordering of such acts or events are not to be interpreted in a limiting sense. For example, some acts or events may occur in different orders, not be implemented and/or occur concurrently with other acts or events. Moreover, it is understood that additional processes can be provided before, during, and/or after the method 2500 in order to produce a complete adhesive layer. Accordingly, some other processes may be briefly described herein.

Figure 26:
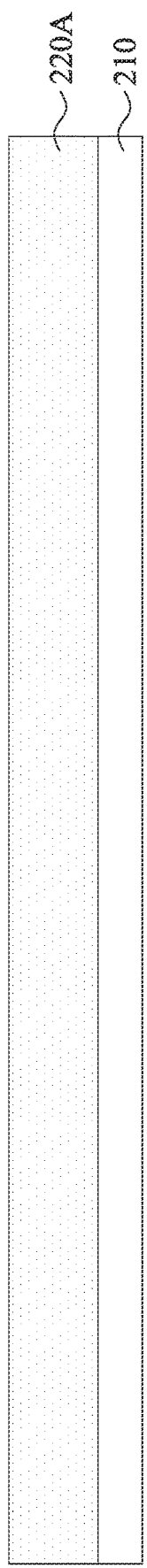
FIGS. 26-28 are a cross-sectional view of various operation stages of fabricating a transferring device used in a fabrication of a display device, in accordance with some embodiments.

Referring to FIGS. 25 and 26, firstly in operation 2502, an adhesive layer 220A is formed on the first substrate 210. A thickness of the adhesive layer 220A may be thick enough to allow the adhesive layer 220A to touch the first surface S1 of the light emitting element 230 (see FIG. 27).

Figure 27:
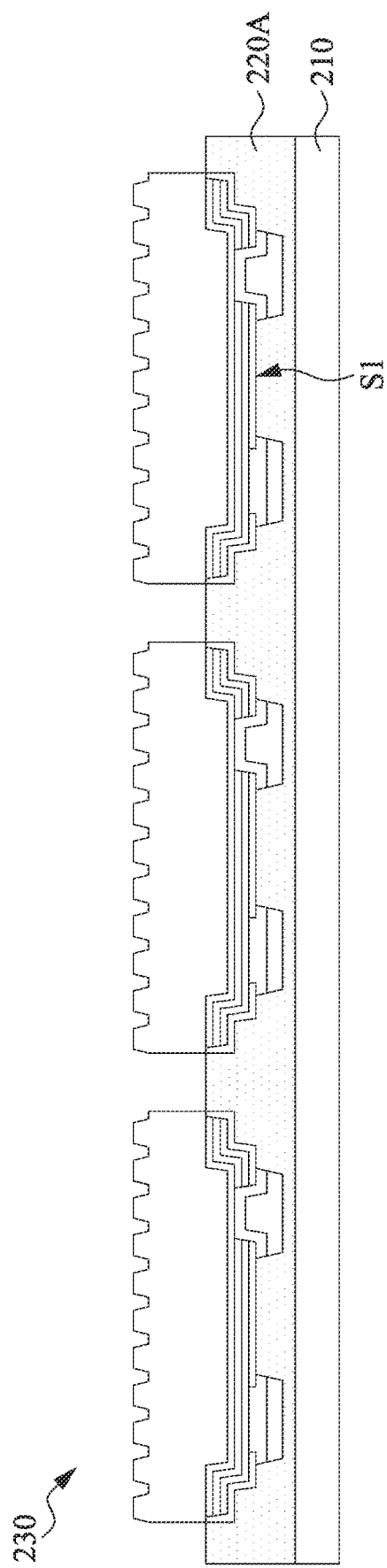

Referring to FIGS. 25 and 27, then in operation 2504, the light emitting element 230 is disposed onto the adhesive layer 220A. In some embodiments, an external force may be exerted on the light emitting element 230 during operation 2504 to ensure the first surface S1 of the light emitting element 230 can touch the adhesive layer 220A. In some embodiments, the light emitting element 230 may not directly contact the first substrate 210 due to the adhesive layer 220A interposing between the light emitting element 230 and the first substrate 210.

Figure 28:
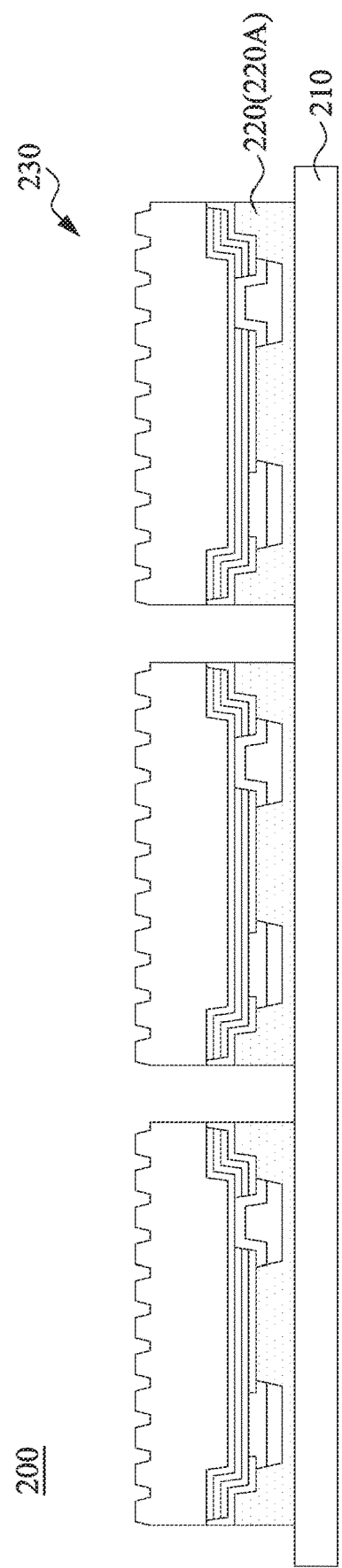

Referring to FIGS. 25 and 28, then in operation 2506, the adhesive layer 220A is patterned after the light emitting element 230 is disposed onto the adhesive layer 220A. In another words, operation 2506 is performed after operation 2504.

Still in FIG. 28, in operation 2508, the transferring device 200 is formed. Because the light emitting element 230 can be disposed onto the adhesive layer 220A prior to a patterning operation (i.e., operation 2506), flexibility in the patterning operation may be limited by a blocking of the light emitting element 230. Consequently, the transferring device 200 with patterned adhesive layer 220 illustrated in FIGS. 2A and 2B may be formed in the above-mentioned process sequence. That is, the resulted patterned adhesive layer 220 can extend to the fourth sidewall W4 of the light emitting element 230.

Figure 29:
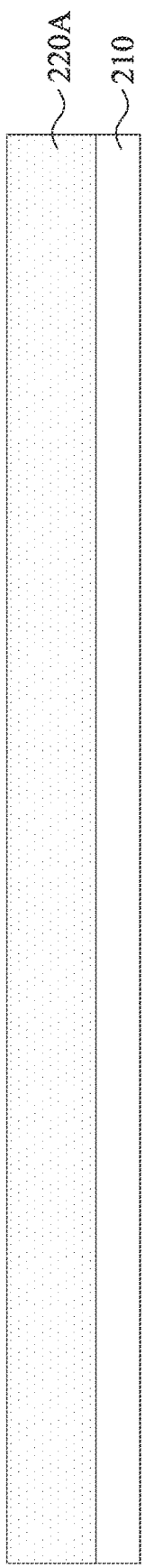

In some embodiments, the method 2500 can be performed in another sequence. Referring to FIGS. 25 and 29, firstly in operation 2502, the adhesive layer 220A is formed on the first substrate 210. The thickness of the adhesive layer 220A may be thick enough to allow the adhesive layer 220A to touch the first surface S1 of the light emitting element 230 (see FIGS. 31A and 31B).

Figure 30:
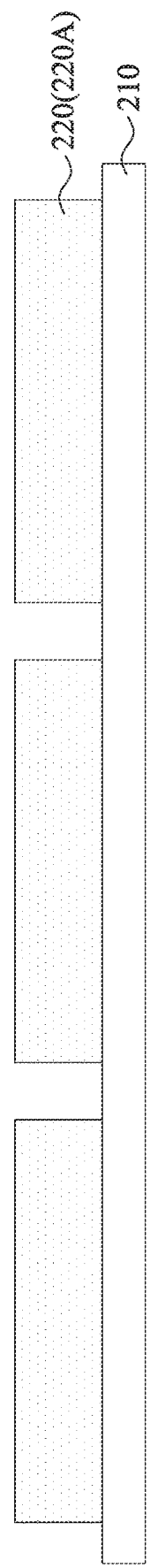

Referring to FIGS. 25 and 30, then in operation 2506, the adhesive layer 220A is patterned to form the patterned adhesive layer 220.

Referring to FIGS. 25 and 31A, then in operation 2504, the light emitting element 230 is disposed onto the patterned adhesive layer 220 after the adhesive layer 220A is patterned. In another words, operation 2504 is performed after operation 2506. In some embodiments, an external force may be exerted on the light emitting element 230 during operation 2504 to ensure the first surface S1 of the light emitting element 230 can touch the patterned adhesive layer 220. In some embodiments, the light emitting element 230 may not directly contact the first substrate 210 due to the patterned adhesive layer 220 interposing between the light emitting element 230 and the first substrate 210.

Still in FIG. 31A, in operation 2508, the transferring device 200 is formed. Because the light emitting element 230 can be disposed onto the adhesive layer 220A after a patterning operation (i.e., operation 2506), flexibility in the patterning operation may not be limited by the light emitting element 230. Consequently, the transferring device 200 with patterned adhesive layer 220 illustrated in FIGS. 2A and 2B may be formed in the above-mentioned process sequence. That is, the resulted patterned adhesive layer 220 can extend to the fourth sidewall W4 of the light emitting element 230. In some embodiments, the patterned adhesive layer 220 can further extend and exceed the fourth sidewall W4 (not illustrated herein). In addition, the transferring device 200 may also include a structure in FIG. 31B in the above-mentioned process sequence, which is similar to the transferring device 200 with the patterned adhesive layer 320 illustrated in FIGS. 3A and 3B. That is, the resulted patterned adhesive layer 320 can range between the second sidewall W2 of the contacts 250 and the fourth sidewall W4 of the light emitting element 230.

The present disclosure discloses various embodiments to provide a display device and a method of fabricating thereof. The display device includes an adhesive barrier wall formed between contacts to prevent an unexpected electrical connection between the contacts, thereby increasing reliability of fabrication.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:
1. A display device, comprising:
   a light emitting element comprising a first contact and a second contact, wherein the first contact and the second contact are disposed on a first surface of the light emitting element;

an adhesive barrier wall disposed on the first surface of the light emitting element and comprising a first portion between the first contact and the second contact; and an array substrate comprising a first pad and a second pad, wherein the first pad and the second pad are disposed on a second surface of the array substrate, wherein the first contact and the second contact of the light emitting element are respectively connected to the first pad and the second pad, and wherein the first portion of the adhesive barrier wall is spaced a distance aprt from the array substrate.

2. The display device of claim 1, wherein the adhesive barrier wall physically contacts the first pad, the second pad, or the first pad and the second pad.

3. The display device of claim 1, wherein a portion of the adhesive barrier wall is between the first contact and the first pad or between the second contact and the second pad.

4. The display device of claim 1, wherein the first portion of the adhesive barrier wall physically contacts the first contact and the second contact.

5. The display device of claim 4, wherein the first portion of the adhesive barrier wall contacts a first sidewall of the first contact and a second sidewall of the second contact, and the first sidewall of the first contact and the second sidewall of the second contact face each other.

6. The display device of claim 5, wherein a lateral space between the first sidewall of the first contact and the second sidewall of the second contact is entirely filled with the adhesive barrier wall.

7. The display device of claim 1, wherein the adhesive barrier wall comprises polyimide (PI) or poly(methyl 2-methylpropenoate) (PMMA).

8. The display device of claim 1, wherein the adhesive barrier wall further comprises a second portion disposed on a third sidewall of the first contact, on a fourth sidewall of the second contact, or on the third sidewall of the first contact and the fourth sidewall of the second contact, wherein the third sidewall and the fourth sidewall face outwards.

9. The display device of claim 8, wherein the second portion of the adhesive barrier wall is disposed on a sidewall of the light emitting element.

10. The display device of claim 1, wherein the adhesive barrier wall further comprises a first subportion abutting the first contact and a second subportion abutting the second contact, wherein the first subportion and the second subportion protrude from the first portion.

11. A method of fabricating display device, comprising:
providing a transferring device, wherein the transferring device comprises:
a first substrate;
a patterned adhesive layer disposed on the first substrate; and
a light emitting element disposed on the patterned adhesive layer and bonded to the first substrate by the patterned adhesive layer;

performing a first laser process to detach and transfer the light emitting element from the first substrate to a second substrate, and to pattern the patterned adhesive layer such that an adhesive barrier wall is formed, wherein the adhesive barrier wall is disposed between a first contact of the light emitting element and a second contact of the light emitting element; and performing a second laser process to bond the light emitting element onto an array substrate, wherein the adhesive barrier wall between the first contact and the second contact is spaced a distance apart from the array substrate.

12. The method of fabricating display device of claim 11, wherein the patterned adhesive layer of the transferring device physically contacts a first surface, a first contact and a second contact of the light emitting element, and the first contact and the second contact are disposed on the first surface.

13. The method of fabricating display device of claim 11, wherein the light emitting element and the patterned adhesive layer physically contacting the light emitting element are detached and transferred together from the first substrate to the second substrate.

14. The method of fabricating display device of claim 11, wherein the adhesive barrier wall partly covers the first contact, the second contact, or the first contact and the second contact.

15. The method of fabricating display device of claim 11, wherein the performing the first laser process comprises irradiating on irradiation areas on the patterned adhesive layer with a laser, and the irradiation areas are spaced apart from each other.

16. The method of fabricating display device of claim 11, wherein the performing the first laser process comprises irradiating on irradiation areas on the patterned adhesive layer with a laser, and the irradiation areas partly overlap each other.

17. The method of fabricating display device of claim 11, wherein the performing the first laser process comprises irradiating on an irradiation area on the patterned adhesive layer with a laser, and the irradiation area covers the first contact and the second contact.

18. The method of fabricating display device of claim 11, wherein the patterned adhesive layer is formed by:
forming an adhesive layer on the first substrate; and
after disposing the light emitting element on the adhesive layer, patterning the adhesive layer to form the patterned adhesive layer.

19. The method of fabricating display device of claim 11, wherein the patterned adhesive layer is formed by:
forming an adhesive layer on the first substrate; and
after patterning the adhesive layer to form the patterned adhesive layer, disposing the light emitting element on the adhesive layer.

* * * * *